United States Patent
Iwai et al.

(10) Patent No.: US 8,036,038 B2
(45) Date of Patent: *Oct. 11, 2011

(54) SEMICONDUCTOR MEMORY DEVICE

(75) Inventors: Makoto Iwai, Yokohama (JP); Kazuhisa Kanazawa, Fujisawa (JP); Hiroshi Nakamura, Fujisawa (JP); Masaki Fujiu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/951,616

(22) Filed: Nov. 22, 2010

(65) Prior Publication Data

US 2011/0063911 A1    Mar. 17, 2011

Related U.S. Application Data

(63) Continuation of application No. 12/329,007, filed on Dec. 5, 2008, now Pat. No. 7,859,901.

(30) Foreign Application Priority Data

Dec. 10, 2007    (JP) ................................ 2007-318851

(51) Int. Cl.
*G11C 11/34*    (2006.01)
(52) U.S. Cl. .................... 365/185.11; 257/309
(58) Field of Classification Search ............. 365/185.11; 257/309

See application file for complete search history.

(56) References Cited

U.S. PATENT DOCUMENTS

| 7,355,231 B2* | 4/2008 | Coursey .................... 257/296 |
| 2004/0165451 A1 | 8/2004 | Wake |
| 2006/0278951 A1 | 12/2006 | Kim |
| 2007/0183213 A1 | 8/2007 | Kusakabe et al. |

FOREIGN PATENT DOCUMENTS

JP    2005-191413    7/2005

* cited by examiner

*Primary Examiner* — Son Dinh
*Assistant Examiner* — Nam Nguyen
(74) *Attorney, Agent, or Firm* — Oblon, Spivak, McClelland, Maier & Neustadt, L.L.P.

(57) ABSTRACT

A semiconductor memory device includes a memory cell array including a plurality of blocks each including a memory cell unit, and a selection transistor which selects the memory cell unit, and a row decoder including a first block selector and a second block selector each of which includes a plurality of transfer transistors which are formed to correspond to the plurality of blocks and arranged adjacent to each other in a word-line direction wherein the diffusion layers are formed to oppose each other in the first block selector and the second block selector, and a width between the diffusion layers of the first block selector and the second block selector adjacent to each other in the word-line direction is made larger than a width between the diffusion layers in each of the first block selector and the second block selector adjacent to each other in the word-line direction.

16 Claims, 20 Drawing Sheets

Overall Arrangement Example (NAND Flash Memory 11)

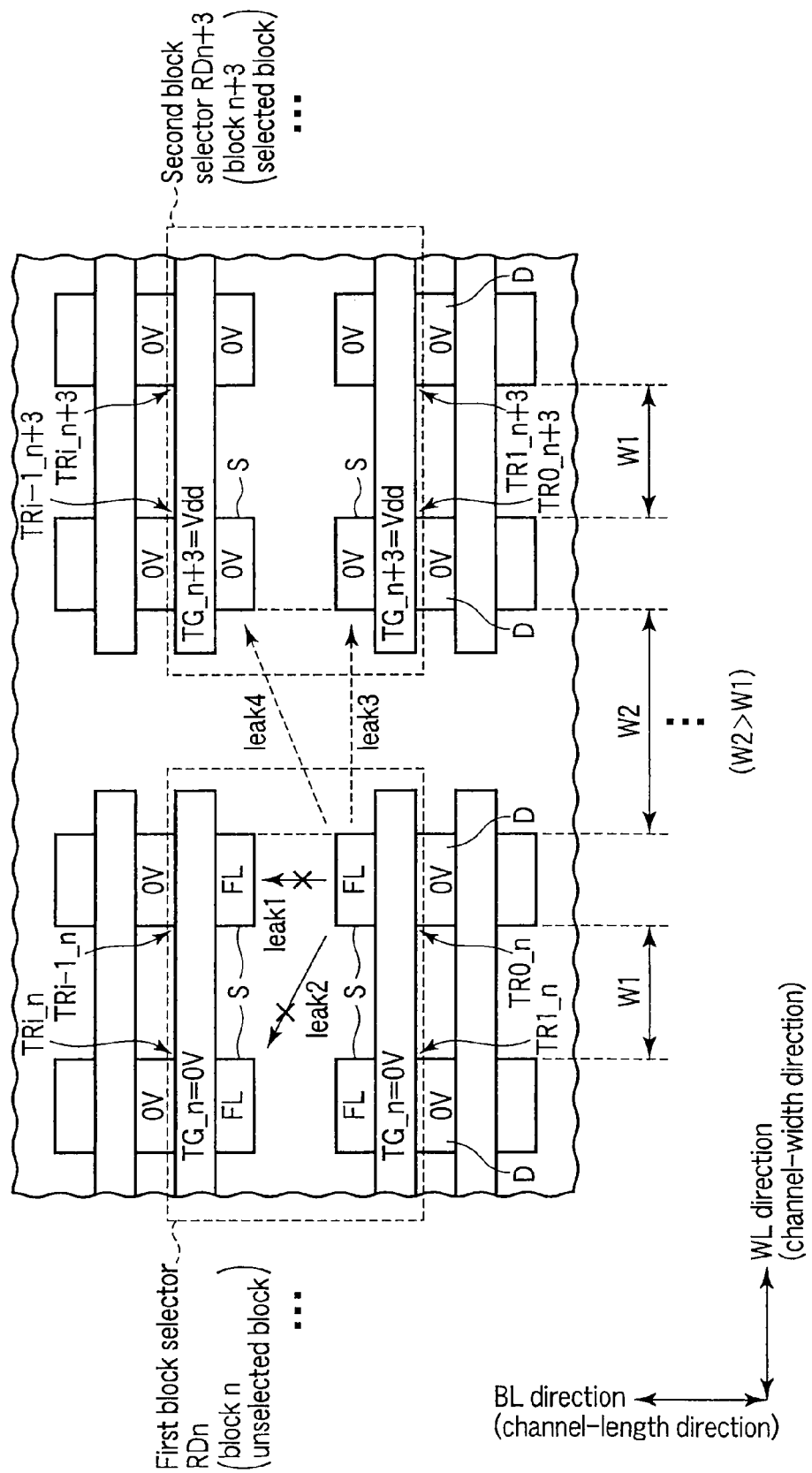
F I G. 1

First Embodiment

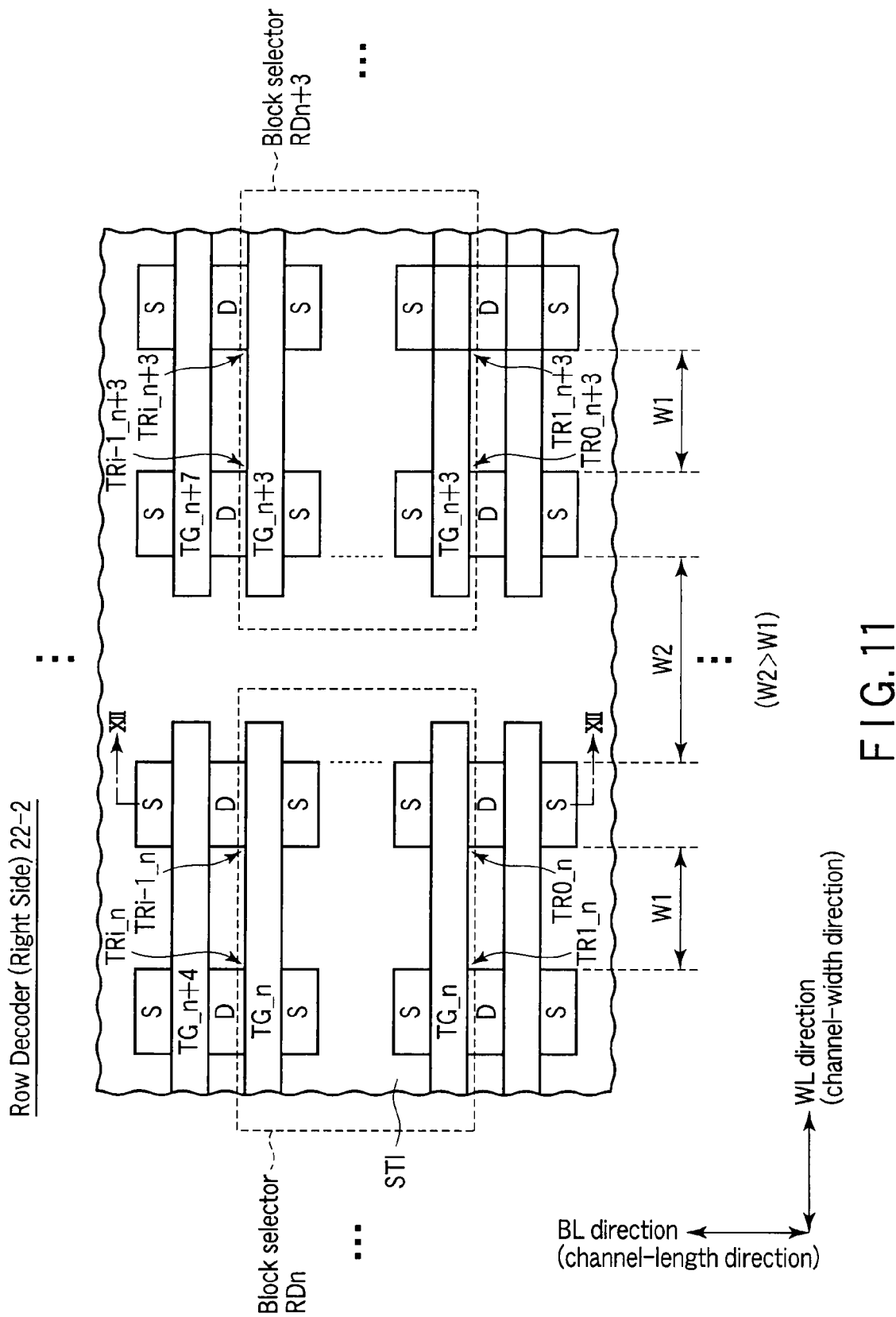
F I G. 11

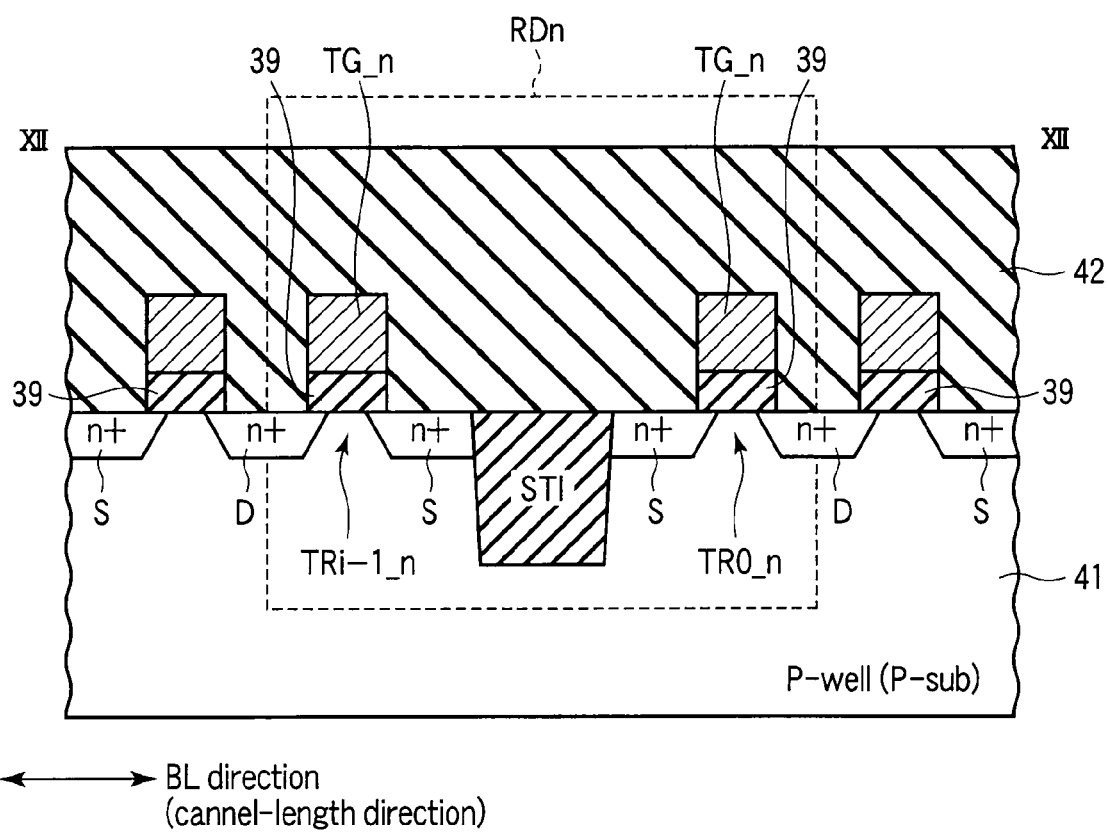
F I G. 12

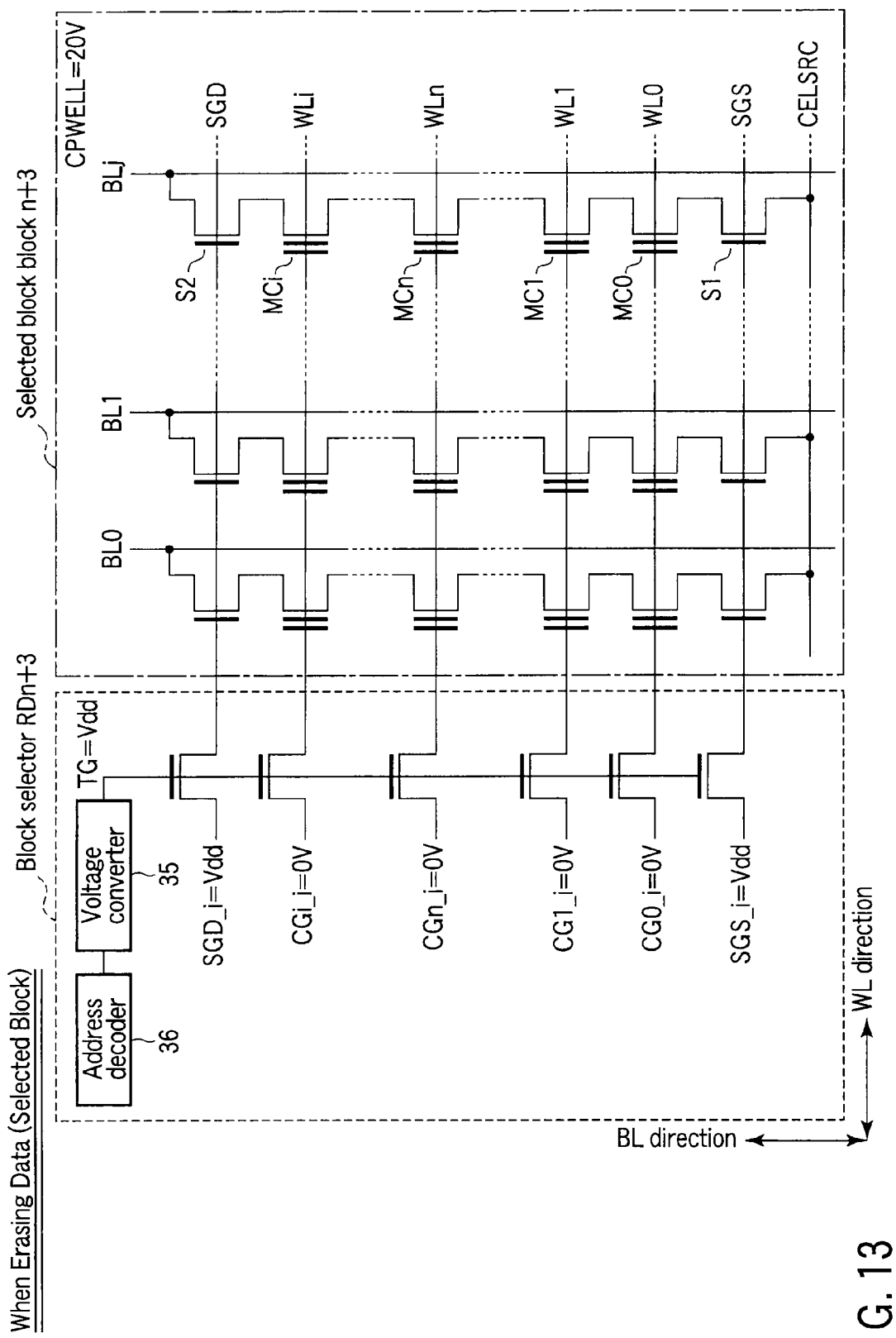
F I G. 13

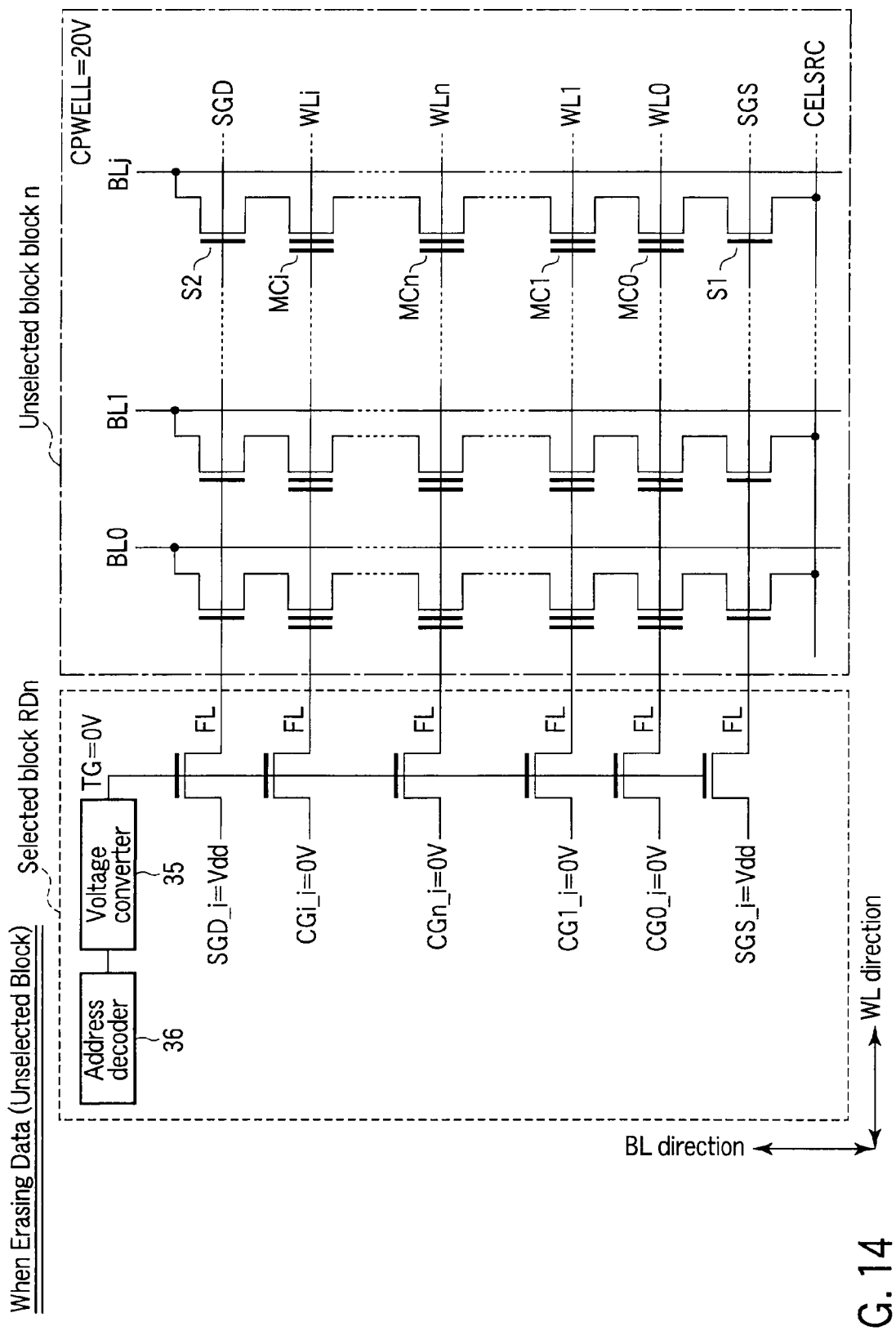
F I G. 14

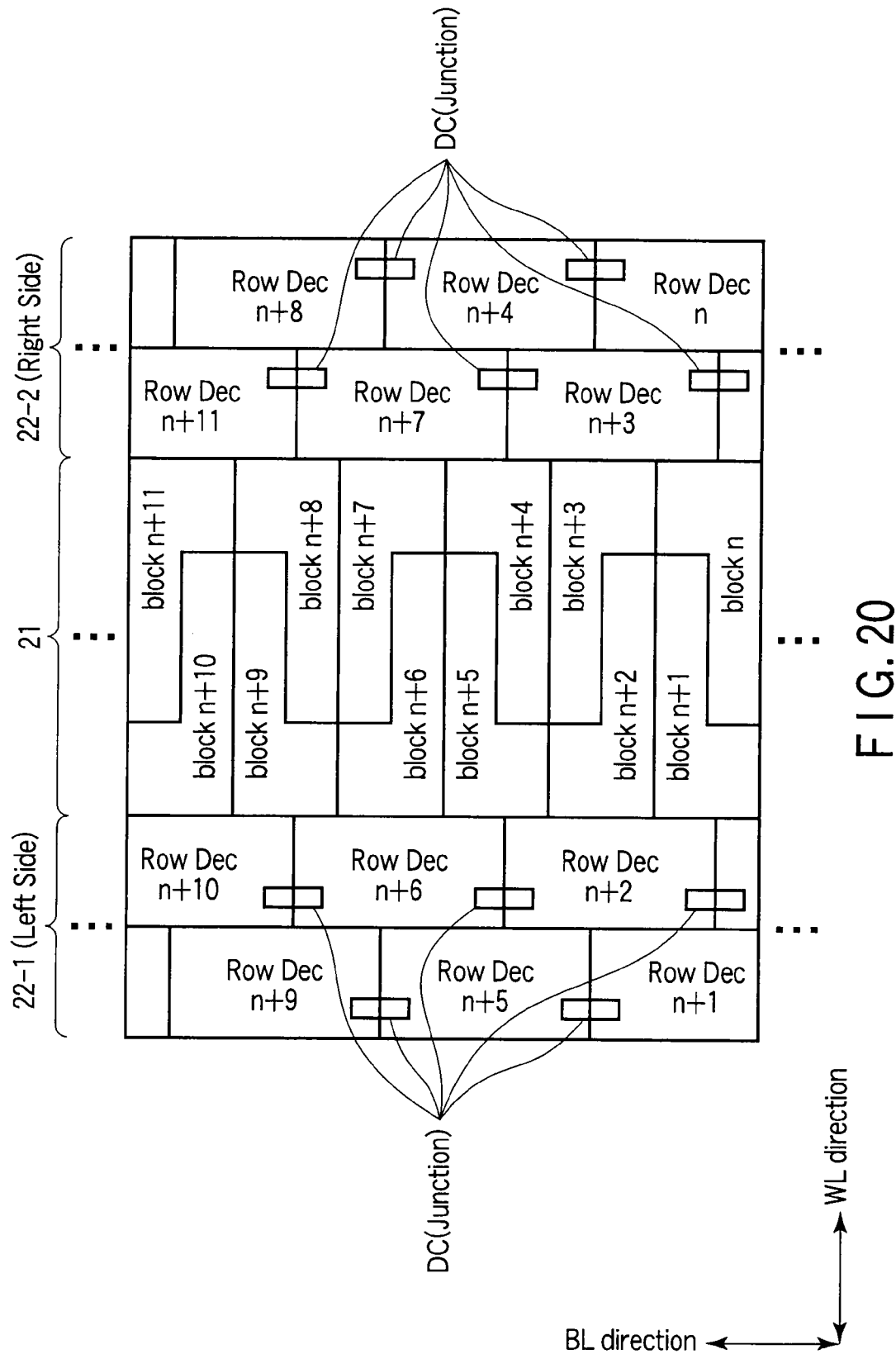
F I G. 20

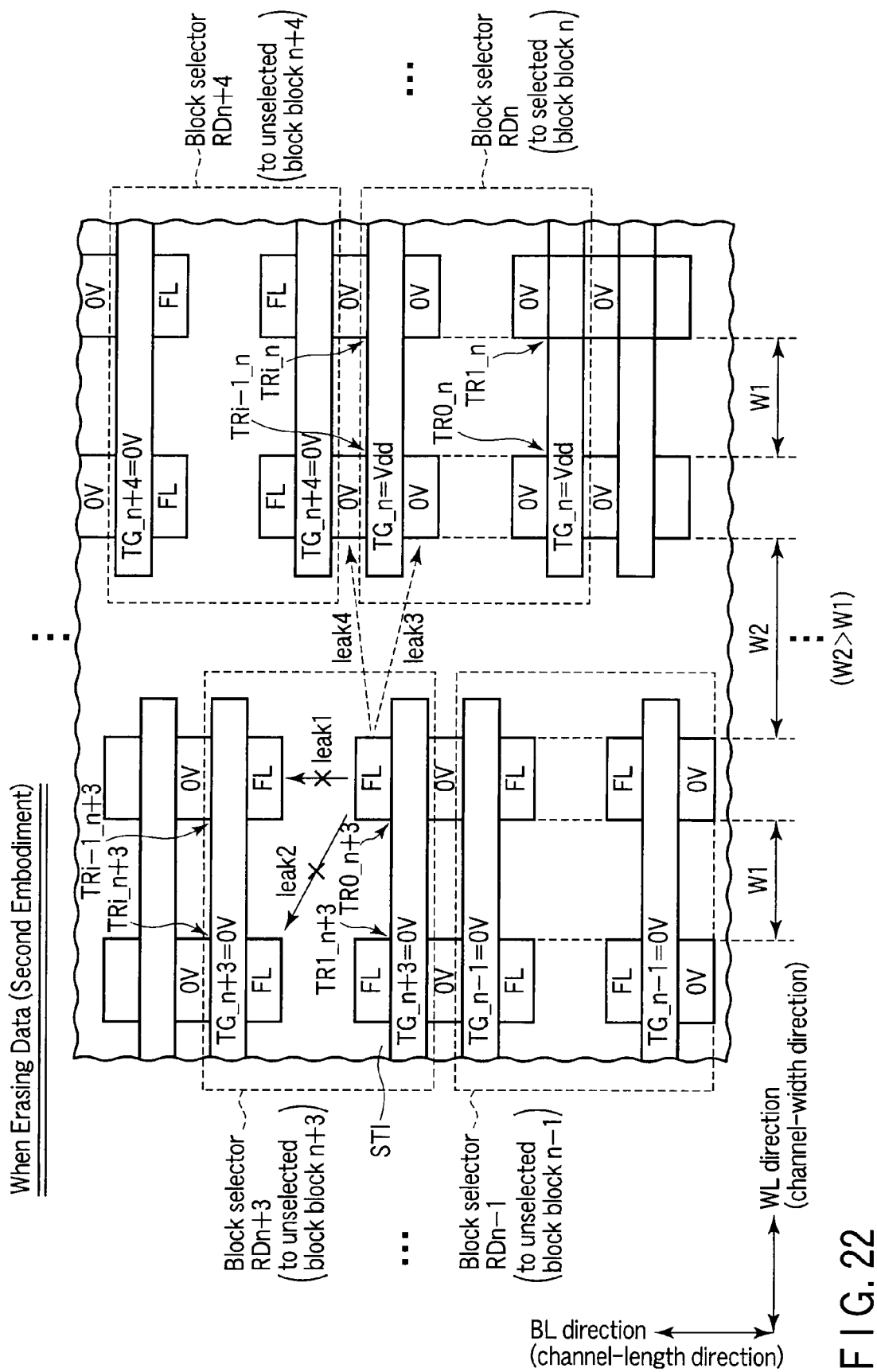
F I G. 22

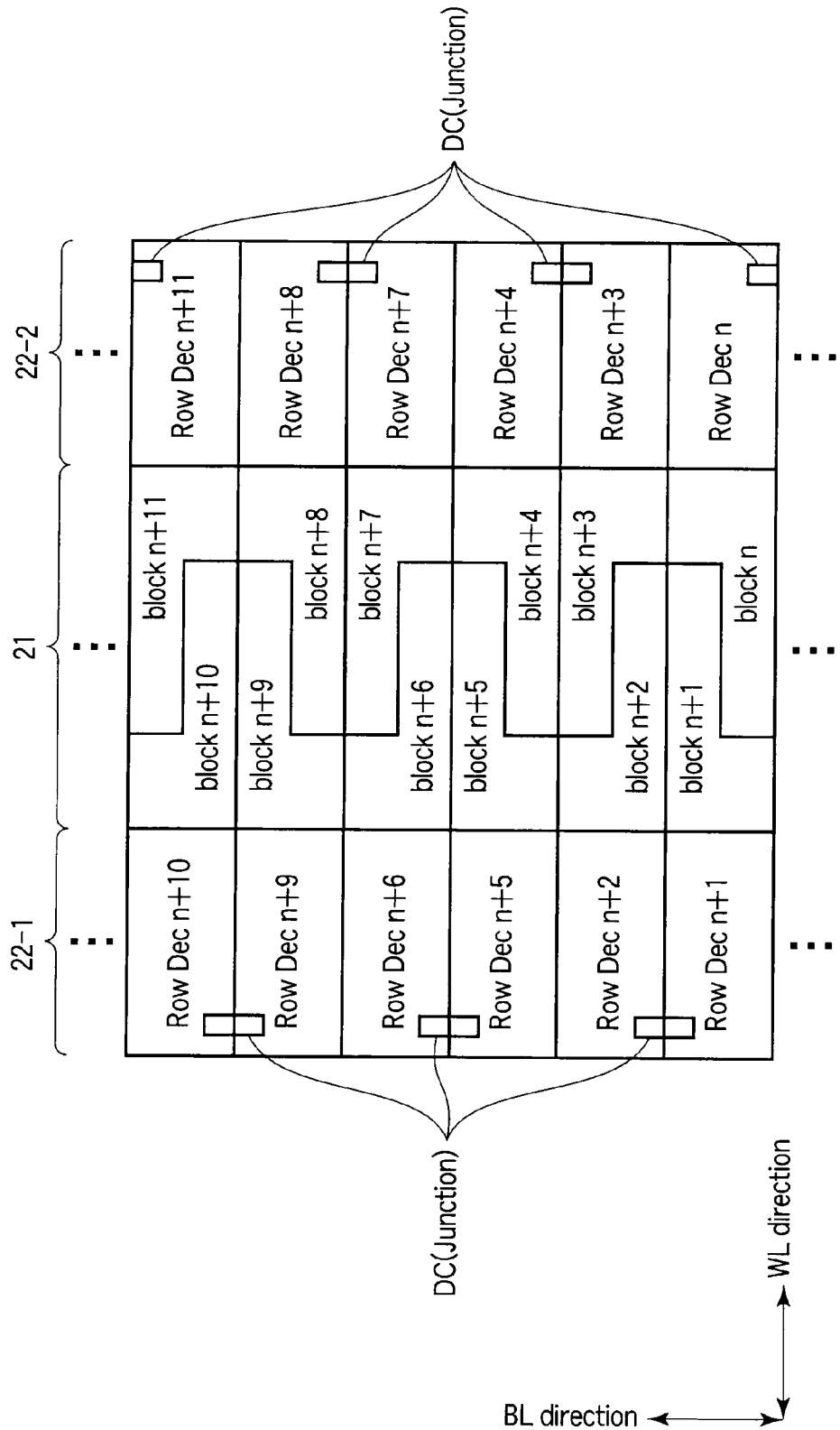
F I G. 23

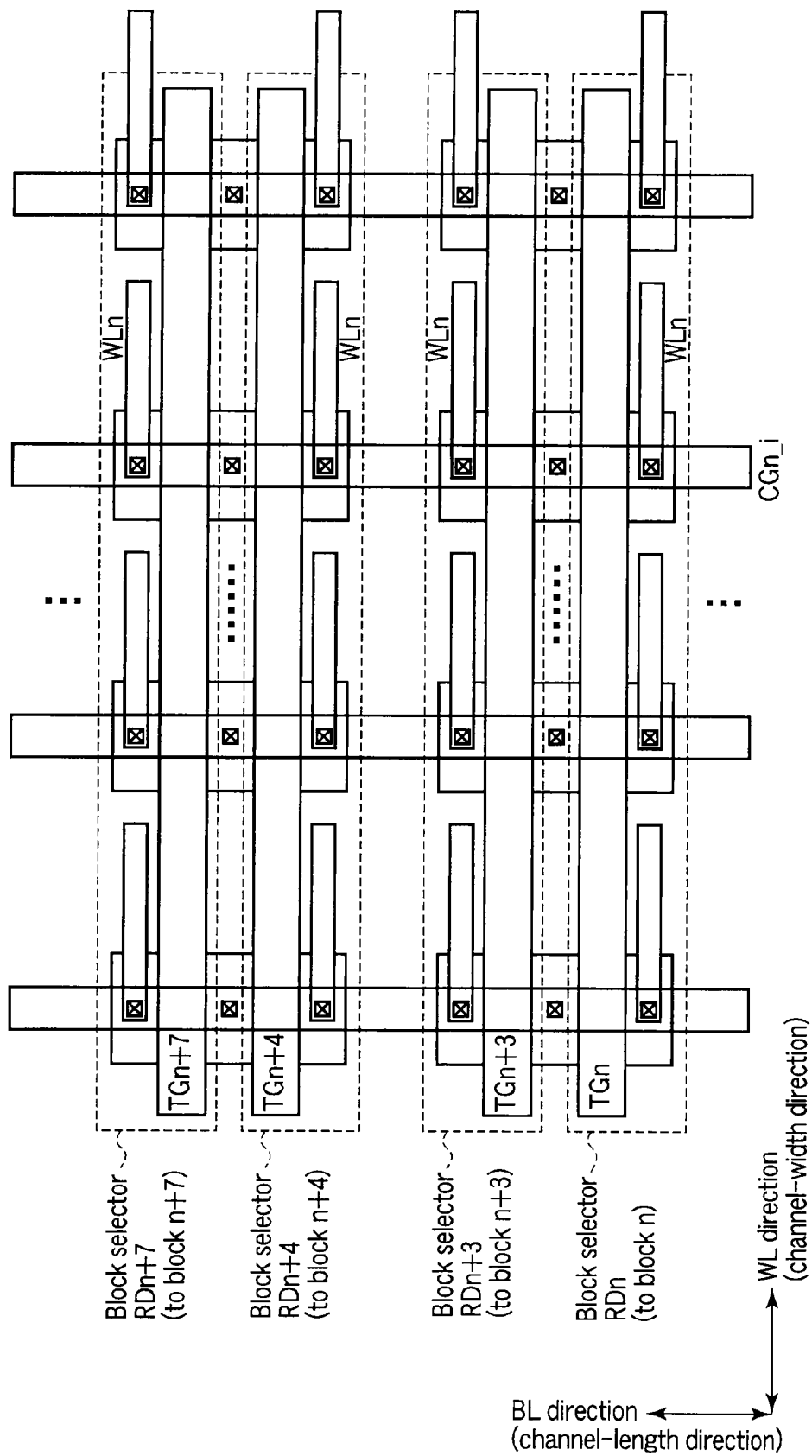
F I G. 24

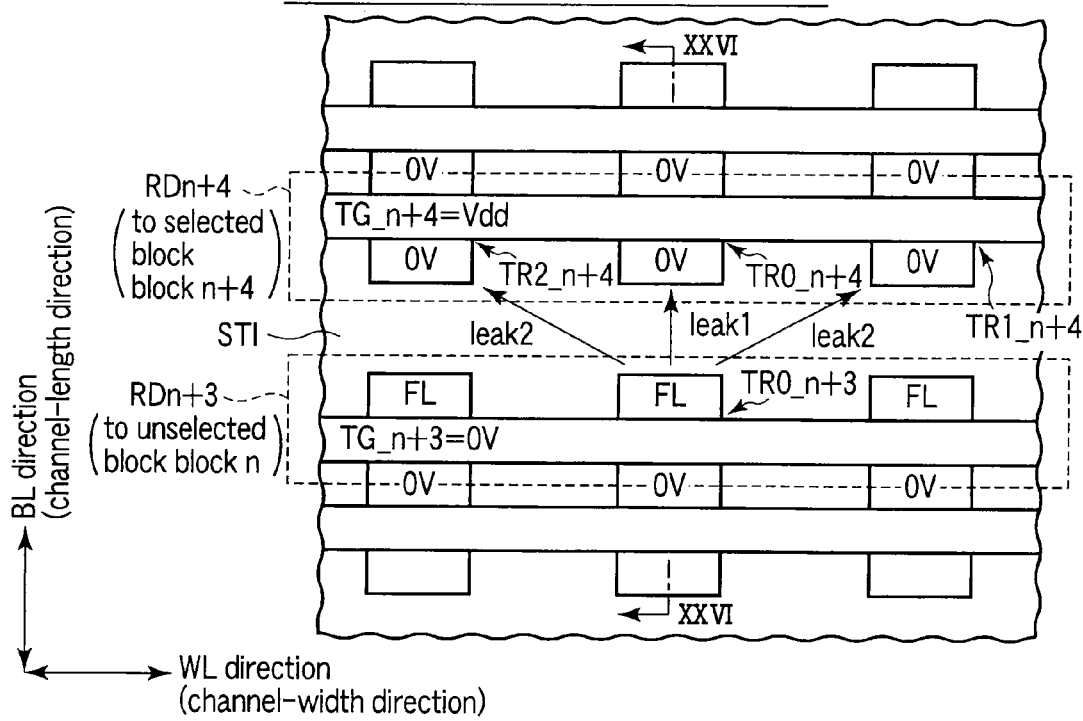
F I G. 25
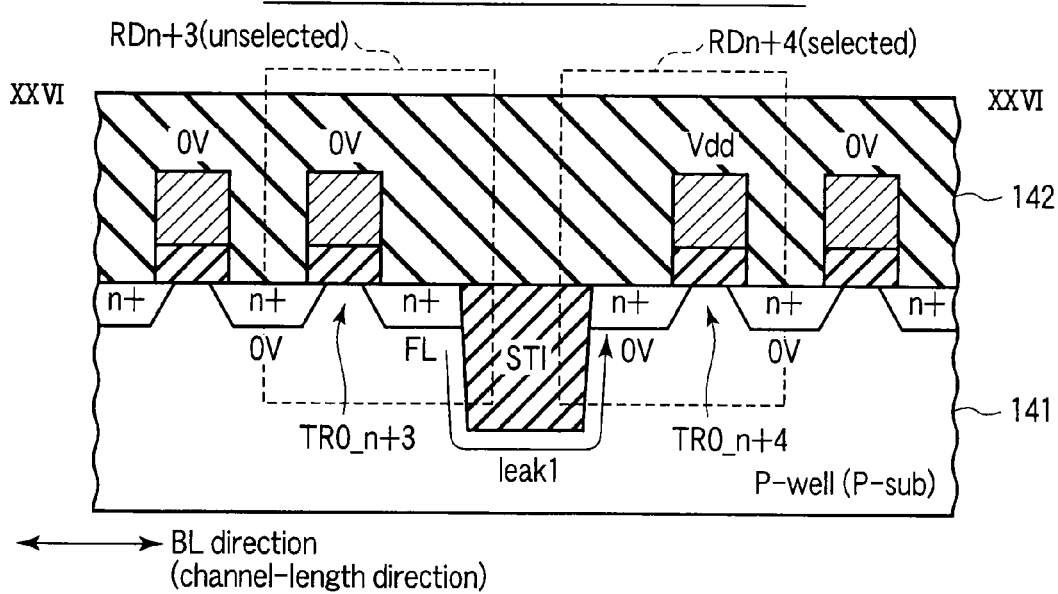
F I G. 26

When Erasing Data (Comparative Example)

When Erasing Data (Unselected Block block n+3): Comparative Example

SEMICONDUCTOR MEMORY DEVICE

CROSS-REFERENCE TO RELATED APPLICATIONS

This application is a continuation application based on U.S. application Ser. No. 12/329,007, filed Dec. 5, 2008 and is based upon and claims the benefit of priority from prior Japanese Patent Application No. 2007-318851, filed Dec. 10, 2007, the entire contents of which are incorporated herein by reference.

BACKGROUND OF THE INVENTION

1. Field of the Invention

The present invention relates to a semiconductor memory device.

2. Description of the Related Art

Recently, many electronic apparatuses incorporating NAND flash memories are commercially available. As the number of functions of these electronic apparatuses increases, it has become necessary to further increase the storage capacities of the NAND flash memories.

Unfortunately, while the distance between interconnections is shortened by the progress of micropatterning resulting from the increase in capacity, the voltage relationship between the interconnections remains unchanged from that of the preceding generation. Consequently, a leakage current in a row decoder placed near a memory cell array causes memory cell erase errors, and increases the number of defective bits.

In a data erase operation of the NAND flash memory, for example, a word line of an unselected block is set to float and boosted to an erase voltage by coupling with the well voltage (CPWELL) (e.g., Jpn. Pat. Appln. KOKAI Publication No. 2005-191413).

In this state, a leakage current caused by a transfer transistor is generated in a block selector in a row decoder connected to the word line of the unselected block. In a memory cell of the unselected block, therefore, the electric charge of the word line boosted by coupling is removed by the leakage current, so the potential of the word line becomes lower than the erase voltage. For example, if the word line voltage drops from the erase voltage (about 20 V) to about 15 V, a potential difference of about 5 V is produced between the control electrode (CG) of the memory cell connected to the word line and the well (p-well). Since this produces a weak erased state, electrons are removed from the floating electrode (FG) of a memory cell in which data is to be held. This causes an erase error and increases the number of defective bits.

Major leakage currents caused by the transfer transistor described above during an erase operation are two leakage currents leak1 and leak2 below.

The leakage current leak1 is a leakage current between diffusion layers, which oppose each other and to which 0 V is applied, of transfer transistors in selected blocks adjacent to each other in the bit-line direction (channel-length direction).

The leakage current leak2 is a leakage current between diffusion layers, which obliquely oppose each other and to which 0 V is applied, of transfer transistors in similar selected blocks adjacent to each other in the bit-line direction.

As described above, the leakage currents leak1 and leak2 must be reduced in order to reduce erase defects.

BRIEF SUMMARY OF THE INVENTION

A semiconductor memory device according to an aspect of the present invention comprising a memory cell array including a plurality of blocks each including a memory cell unit in which current paths of a plurality of memory cells arranged in a matrix at intersections of a plurality of bit lines and a plurality of word lines are connected in series, and a selection transistor which selects the memory cell unit; and a row decoder including a first block selector and a second block selector each of which includes a plurality of transfer transistors having current paths whose ends are electrically connected to the plurality of word lines, and which are formed to correspond to the plurality of blocks and arranged adjacent to each other in a word-line direction, wherein diffusion layers as the ends of the current paths of the transfer transistors are formed to oppose each other in the first block selector and the second block selector, and a width between the diffusion layers of the first block selector and the second block selector adjacent to each other in the word-line direction is made larger than a width between the diffusion layers in each of the first block selector and the second block selector adjacent to each other in the word-line direction.

A semiconductor memory device according to another aspect of the present invention comprising a memory cell array including a plurality of blocks each including a memory cell unit in which current paths of a plurality of memory cells arranged in a matrix at intersections of a plurality of bit lines and a plurality of word lines are connected in series, and a selection transistor which selects the memory cell unit; and a row decoder including a first block selector and a second block selector each of which includes a plurality of transfer transistors having current paths whose ends are electrically connected to the plurality of word lines, and which are formed to correspond to the plurality of blocks and arranged adjacent to each other in a word-line direction, wherein diffusion layers as the ends of the current paths of the transfer transistors are formed to oppose each other in the first block selector and the second block selector, a width between the diffusion layers of the first block selector and the second block selector adjacent to each other in the word-line direction is made larger than a width between the diffusion layers in each of the first block selector and the second block selector adjacent to each other in the word-line direction, and the first block selector and the second block selector are staggered by shifting pitches in a bit-line direction.

BRIEF DESCRIPTION OF THE SEVERAL VIEWS OF THE DRAWING

FIG. 1 is a plan view for explaining a nonvolatile semiconductor device according to an outline of the present invention;

FIG. 11 is a plan view showing a row decoder of the nonvolatile semiconductor device according to the first embodiment;

FIG. 12 is a sectional view taken along a line XII-XII in FIG. 11;

FIG. 13 is an equivalent circuit diagram showing a selected block and block selector according to the first embodiment when erasing data;

FIG. 14 is an equivalent circuit diagram showing an unselected block and block selector according to the first embodiment when erasing data;

FIG. 20 is a block diagram showing a memory cell array unit of a nonvolatile semiconductor device according to the second embodiment of the present invention;

FIG. 22 is a plan view showing the voltage relationship in the row decoder according to the second embodiment when erasing data;

FIG. 23 is a plan view showing a memory cell array unit of a nonvolatile semiconductor device according to a comparative example of the present invention;

FIG. 24 is a plan view showing a row decoder of the nonvolatile semiconductor device according to the comparative example;

FIG. 25 is a plan view showing the voltage relationship in the row decoder according to the comparative example when erasing data;

FIG. 26 is a sectional view taken along a line XXVI-XXVI in FIG. 25;

DETAILED DESCRIPTION OF THE INVENTION

[Outline]

Figure 2:
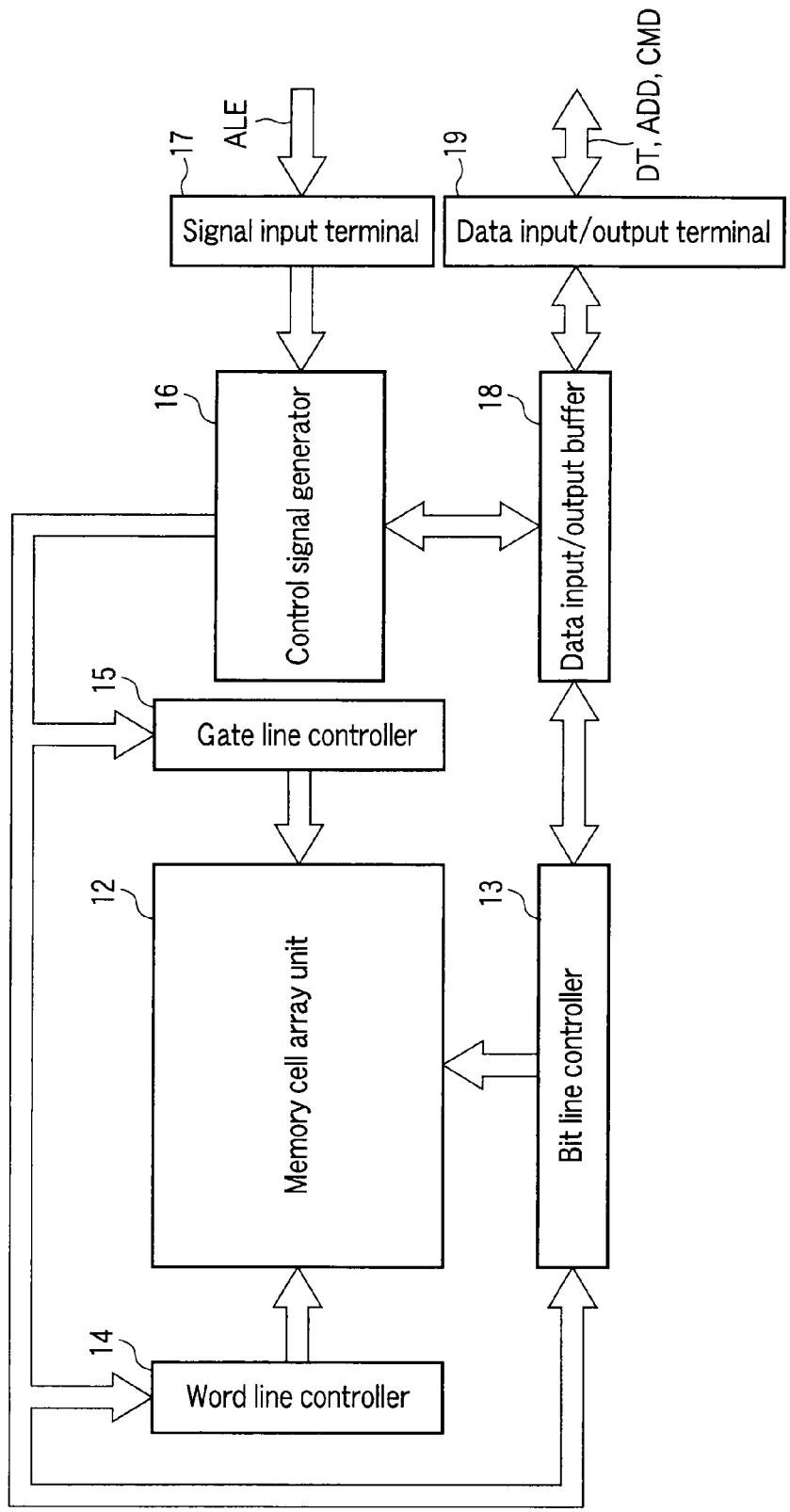
FIG. 2 is a block diagram showing an example of the overall arrangement of a nonvolatile semiconductor device according to the first embodiment of the present invention.

First, an outline of the present invention will be explained below with reference to FIG. 1.

An example of the present invention proposes a semiconductor memory device capable of reducing leakage currents in a row decoder and advantageous in preventing an erase error in a memory cell.

FIG. 1 shows an example of the arrangement of this semiconductor memory device.

That is, the semiconductor memory device comprises a memory cell array (not shown) and row decoder 22. The memory cell array includes a plurality of blocks each having a memory cell unit and a selection transistor for selecting the memory cell unit. In the memory cell unit, the current paths of a plurality of memory cells arranged in a matrix at the intersections of a plurality of bit lines and a plurality of word lines are connected in series. The row decoder 22 includes first and second block selectors (RDn and RDn+3) arranged adjacent to each other in the word-line direction. The first and second block selectors each have a plurality of transfer transistors (TR), and are formed to correspond to the plurality of blocks. One end of the current path of each transfer transistor is electrically connected to a corresponding one of the plurality of word lines.

Diffusion layers (S) as the ends of the current paths of the transfer transistors (TR) are arranged to oppose each other in each of the first and second block selectors.

The width (W2) between the diffusion layers of the first and second block selectors adjacent to each other in the word-line direction is made larger than the width (W1) between the diffusion layers in each of the first and second block selectors adjacent to each other in the word-line direction (widths: W2>W1).

First, as described above, the diffusion layers (S) as the ends of the current paths of the transfer transistors (TR) are arranged to oppose each other in each of the first and second block selectors. In other words, the sources S of the diffusion layers connected to word lines WL are arranged to oppose each other in the same block selector. In the first block selector RDn, for example, the sources S as the diffusion layers of transfer transistors TR0_n to TRi_n are arranged to oppose each other in the first block selector RDn.

When erasing data from a memory cell, therefore, the voltage relationship is such that the same floating voltage FL is applied to the sources S as the diffusion layers of the transfer transistors TR0_n to TRi_n. Consequently, leakage currents leak1 and leak2 shown in FIG. 1 are not generated. The leakage current leak1 is a leakage current between the diffusion layers, which oppose each other, of transfer transistors adjacent to each other in the BL-line direction (channel-length direction) in the same block selector. The leakage current leak2 is a leakage current between the diffusion layers, which obliquely oppose each other, of similar transfer transistors.

Second, the width (W2) between the diffusion layers of the first and second block selectors adjacent to each other in the word-line direction is made larger than the width (W1) between the diffusion layers in each of the first and second block selectors adjacent to each other in the word-line direction (widths: W2>W1). In other words, the space (W2) between the diffusion layers of block selectors adjacent to each other in the WL direction is made larger than the space (W1) between the diffusion layers in the WL direction in the same block selector. For example, the width (W2) between the diffusion layers S of the first and second block selectors RDn and RDn+3 adjacent to each other in the word-line direction is made larger than the width (W1) between the diffusion layers S in each of the first and second block selectors RDn and RDn+3 adjacent to each other in the word-line direction (widths: W2>W1).

As shown in FIG. 1, therefore, it is possible to reduce leakage currents leak3 and leak4 generated between the first and second block selectors RDn and RDn+3 adjacent to each other in the WL direction. The leakage current leak3 is a leakage current generated between the diffusion layers S, which oppose each other in the WL direction, of the first and second block selectors RDn and RDn+3 adjacent to each other in the word-line direction. The leakage current leak4 is a leakage current generated between the diffusion layers S, which obliquely oppose each other, of the first and second block selectors RDn and RDn+3.

The current amounts of the leakage currents leak3 and leak4 can be made negligibly small by making the width W2 larger than the width W1. Accordingly, the arrangement shown in FIG. 1 can reduce the leakage currents leak3 and leak4.

Thus, the arrangement as described above is capable of reducing the leakage currents in the row decoder, and advantageous in preventing erase errors in memory cells.

Probably best embodiments of the present invention will be explained below with reference to the accompanying drawing. Although a NAND flash memory will be taken as an example in the following explanation, the present invention is not limited to this. Note that in this explanation, the same reference numerals denote the same parts throughout the drawing.

First Embodiment

1. Arrangement Examples 1-1. Example of Overall Arrangement

First, an example of the overall arrangement of a semiconductor memory device according to the first embodiment of the present invention will be explained below with reference to FIG. 2. FIG. 2 is a block diagram showing the example of the overall arrangement of the semiconductor memory device according to the first embodiment.

As shown in FIG. 2, a NAND flash memory according to this embodiment comprises a memory cell array unit 12, bit line controller 13, word line controller 14, gate line controller 15, control signal generator 16, signal input terminal 17, data input/output buffer 18, and data input/output terminal 19.

The memory cell array unit 12 comprises a memory cell array, row decoder, and page buffer (none of them is shown) as will be described later. The memory cell array includes a plurality of blocks ( . . . , block n, block n+1, block n+2, . . . ) Each block comprises a memory cell unit in which the current paths of a plurality of memory cell transistors arranged in a matrix at the intersections of a plurality of word lines and a plurality of bit lines are connected in series, and a selection transistor for selecting the memory cell unit.

The row decoder is positioned near the memory cell array, and applies a predetermined voltage to word lines in, e.g., a data erase operation.

The page buffer is positioned near the memory cell array, and has a plurality of sense amplifiers respectively connected to a plurality of bit lines.

The bit line controller 13 reads out data from a memory cell transistor in the memory cell array unit 12 via a bit line, and detects the state of a memory cell transistor in the memory cell array 12 via a bit line. Also, the bit line controller 13 applies a write control voltage to a memory cell in a memory cell array 11 via a bit line, thereby writing data in the memory cell. The bit line controller 13 is connected to the memory cell array unit 12, data input/output buffer 18, and control signal generator 16.

The word line controller 14 selects a word line in the memory cell array unit 12, and applies a voltage necessary for read, write, or erase to the selected word line.

The gate line controller 15 controls the gate voltage of a transfer gate line in the row decoder.

The control signal generator 16 is connected to the bit line controller 13, word line controller 14, gate line controller 15, and data input/output buffer 18, and controls these connected circuits. The control signal generator 16 is controlled by a control signal such as an ALE (Address Latch Enable) signal input from an external host apparatus via the signal input terminal 17.

The word line controller 14, bit line controller 13, gate line controller 15, and control signal generator 16 form a write circuit, read circuit, and erase circuit.

The signal input terminal 17 is connected to the external host apparatus or the like, and receives a control signal such as the ALE signal described above.

The data input/output buffer 18 outputs memory cell transistor read/write data DT to the data input/output terminal 19.

The data input/output terminal 19 is connected to the host apparatus or the like outside the NAND flash memory, and exchanges the read/write data DT, addresses ADD, and commands CMD. The host apparatus is, e.g., a microcomputer, and receives the data output from the data input/output terminal 19. The host apparatus also outputs the various commands CMD for controlling the operation of the NAND flash memory, the addresses ADD, and data DT. Write data input from the host apparatus to the data input/output terminal 19 is supplied to the bit line controller 13 via the data input/output buffer 18. On the other hand, the commands CMD and addresses ADD are supplied to the control signal generator 16.

1-2. Example of Arrangement of Memory Cell Array Unit

An example of the arrangement of the memory cell array unit 11 will be explained below with reference to FIGS. 3 to 6.

As shown in FIGS. 3 to 6, the memory cell array unit 11 comprises a memory cell array 21, row decoders 22-1 and 22-2, and page buffers 23-1 and 23-2.

The memory cell array 21 includes a plurality of blocks ( . . . , block n, block n+1, block n+2, . . . ) Each block has a memory cell unit in which the current paths of a plurality of memory cell transistors arranged in a matrix at the intersections of a plurality of word lines and a plurality of bit lines are connected in series, and a selection transistor for selecting the memory cell unit.

The row decoders 22-1 and 22-2 are arranged near the memory cell array 21, and apply a predetermined voltage to word lines in, e.g., a data erase operation.

The page buffers 23-1 and 23-2 are arranged near the memory cell array 21, and includes a plurality of sense amplifiers (S/A) respectively connected to a plurality of bit lines.

Examples of the layout of the row decoders and page buffers will be explained below.

Figure 3:
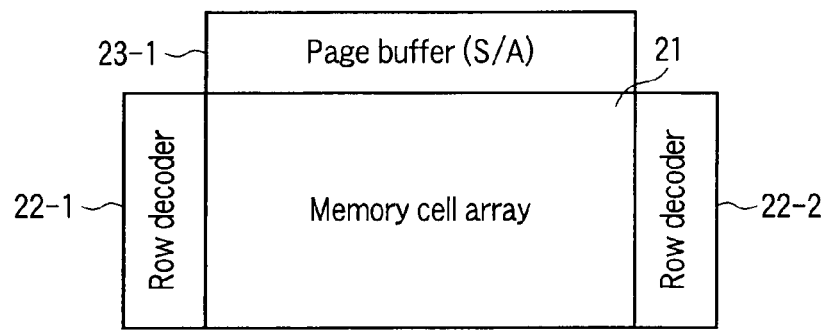
FIG. 3 is a block diagram showing a memory cell array unit of the nonvolatile semiconductor device according to the first embodiment.

First, FIG. 3 shows the layout of the row decoders and page buffer according to this embodiment. As shown in FIG. 3, the row decoders 22-1 and 22-2 are respectively arranged on the left and right sides of the memory cell array 21. The page buffer 23-1 is positioned above the memory cell array.

Figure 4:
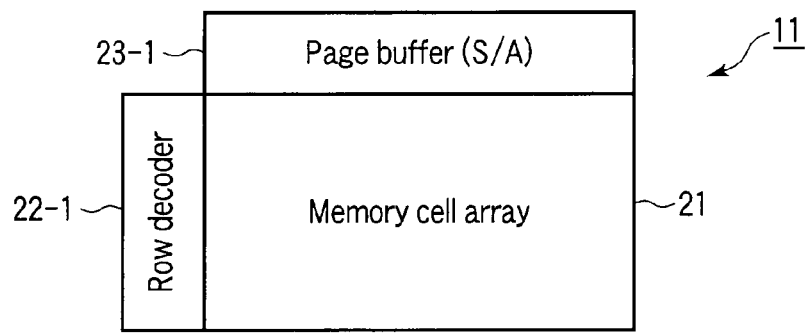
FIG. 4 is a block diagram showing the memory cell array unit of the nonvolatile semiconductor device according to the first embodiment.

In the layout shown in FIG. 4, the row decoder 22-1 alone is positioned on the left side of the memory cell array 21, and the page buffer 23-1 alone is positioned above the memory cell array.

In the layout shown in FIG. 5, the row decoder 22-1 alone is positioned on the left side of the memory cell array 21, and the page buffers 23-1 and 23-2 are respectively arranged above and below the memory cell array.

Figure 6:
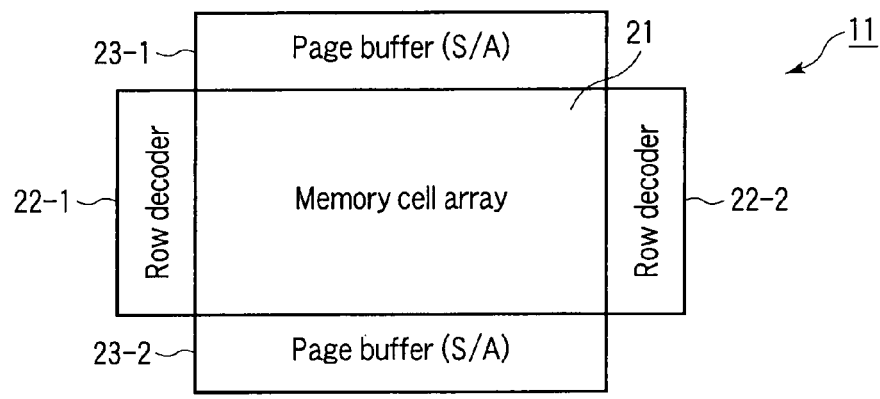
FIG. 6 is a block diagram showing the memory cell array unit of the nonvolatile semiconductor device according to the first embodiment.

In the layout shown in FIG. 6, the row decoders 22-1 and 22-2 are respectively arranged on the left and right sides of the memory cell array 21, and the page buffers 23-1 and 23-2 are respectively arranged above and below the memory cell array.

Any of the layouts shown in FIGS. 3 to 6 can be selected as needed. Note that as described above, this embodiment will be explained by taking the layout shown in FIG. 3 as an example.

1-3. Example of Arrangement of Block

An example of the arrangement of the blocks forming the memory cell array 21 will now be explained with reference to FIGS. 7 and 8.

Figure 7:
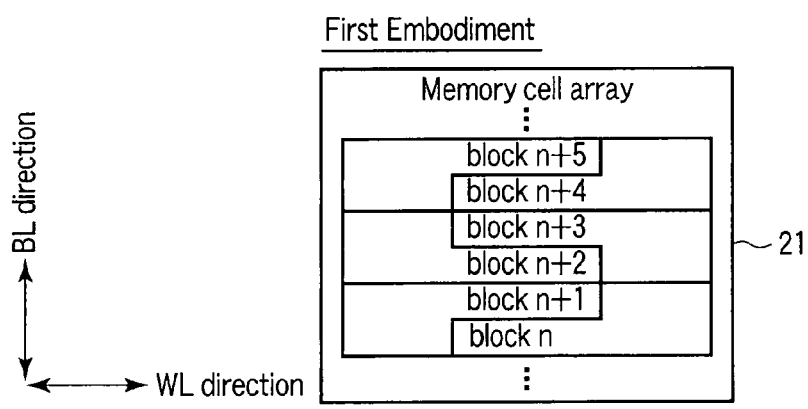
FIG. 7 is a block diagram showing a memory cell array of the nonvolatile semiconductor device according to the first embodiment.

First, FIG. 7 shows the layout of the blocks according to this embodiment. FIG. 7 shows the structure of the memory cell array when the row decoders are arranged on the two sides as shown in FIGS. 3 and 6. As shown in FIG. 7, a plurality of blocks ( . . . , block n, block n+1, block n+2, . . . ) are alternately connected two by two to the row decoders on the two sides. This arrangement can secure a wide interconnection region for connecting the memory cell array 21 and row decoders 22.

Figure 5:
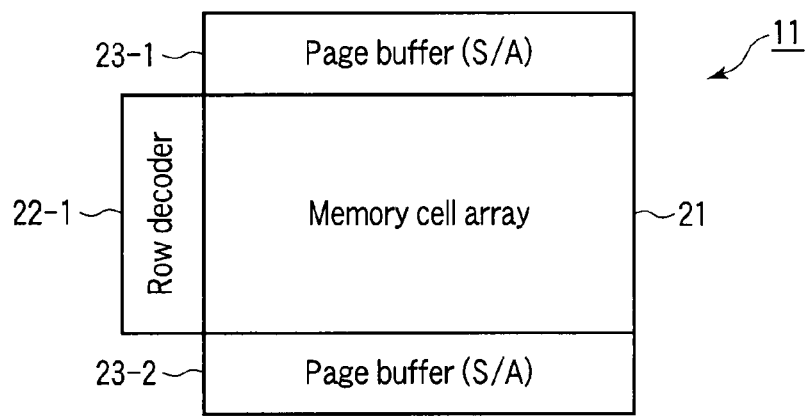
FIG. 5 is a block diagram showing the memory cell array unit of the nonvolatile semiconductor device according to the first embodiment.
Figure 8:
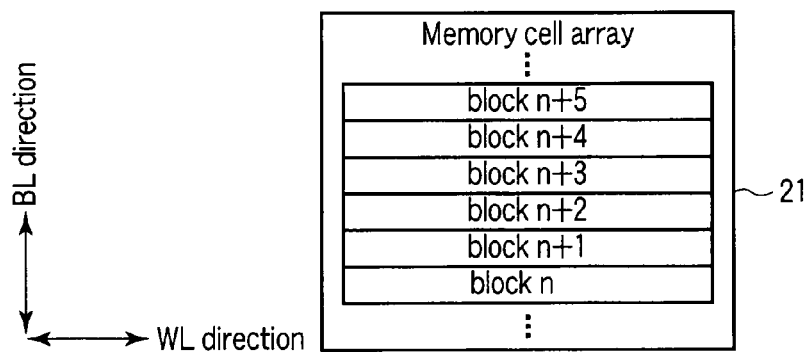
FIG. 8 is a block diagram showing the memory cell array of the nonvolatile semiconductor device according to the first embodiment.

FIG. 8 shows the structure of the memory cell array when the row decoder is positioned on one side as shown in FIGS. 4 and 5. In this layout shown in FIG. 8, a plurality of blocks ( . . . , block n, block n+1, block n+2, . . . ) are arranged in the memory cell array 21 along the bit-line direction. This arrangement can reduce the cell area because the row decoder 22 is placed on only one side of the memory cell array 21.

Either of the layouts shown in FIGS. 7 and 8 can be selected as needed. Note that as described above, this embodiment will be explained by taking the layout shown in FIG. 7 as an example.

1-4. Examples of Arrangements of Memory Cell Array and Row Decoder

Examples of the arrangements of the memory cell array and row decoders 22-1 and 22-2 according to this embodiment will be explained below with reference to FIG. 9.

Figure 9:
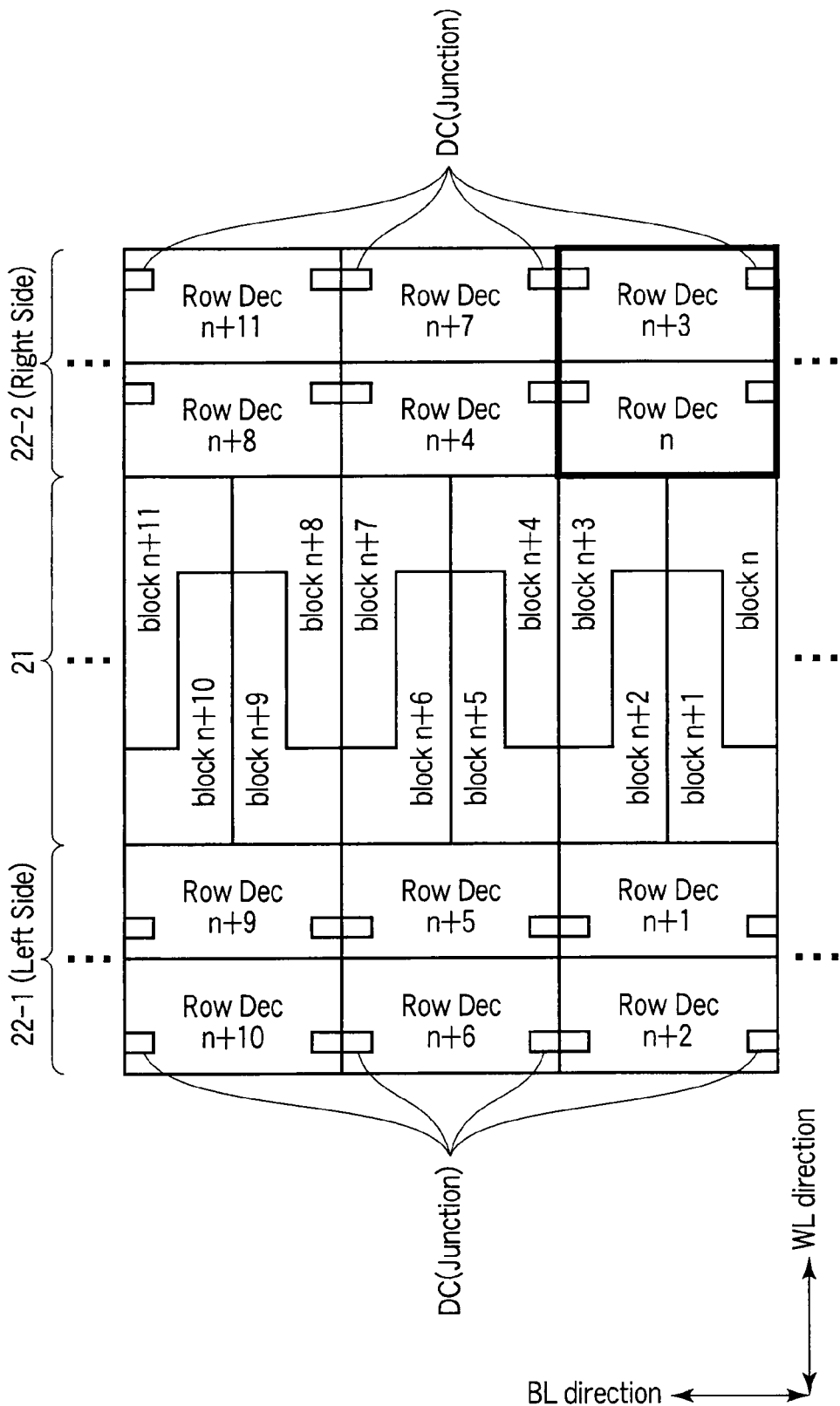
FIG. 9 is a block diagram showing the memory cell array unit of the nonvolatile semiconductor device according to the first embodiment.

In this embodiment as shown in FIG. 9, the row decoders 22-1 and 22-2 are respectively arranged on the left and right sides of the memory cell array 21.

The row decoders 22-1 and 22-2 are formed to correspond to a plurality of blocks ( . . . , block n, block n+1, block n+2, . . . ) in the memory cell array 21, and comprise block selectors ( . . . , Row Dec n (to be referred to as RDn hereinafter), Row Dec n+1, . . . ) arranged adjacent to each other in the word-line direction. For example, as enclosed with the thick lines, the row decoder 22-2 includes two block selectors (RDn and RDn+3) corresponding to two blocks (block n and block n+3).

Also, block selectors ( . . . , RDn, RDn+4, . . . ) adjacent to each other in the bit-line direction in the row decoders 22-1 and 22-2 share a drain contact DC (Junction). For example, the block selectors RDn and RDn+4 adjacent to each other in the bit-line direction in the row decoder 22-2 share the drain contact DC (Junction).

1-5. Examples of Circuit Configurations of Block and Block Selector

Examples of the circuit configurations of the block and block selector will be explained below with reference to FIG. 10. The block (block n) and block selector (RDn) will be explained as examples. Data is erased block by block in the NAND flash memory. Therefore, the block is an erase unit.

Figure 10:
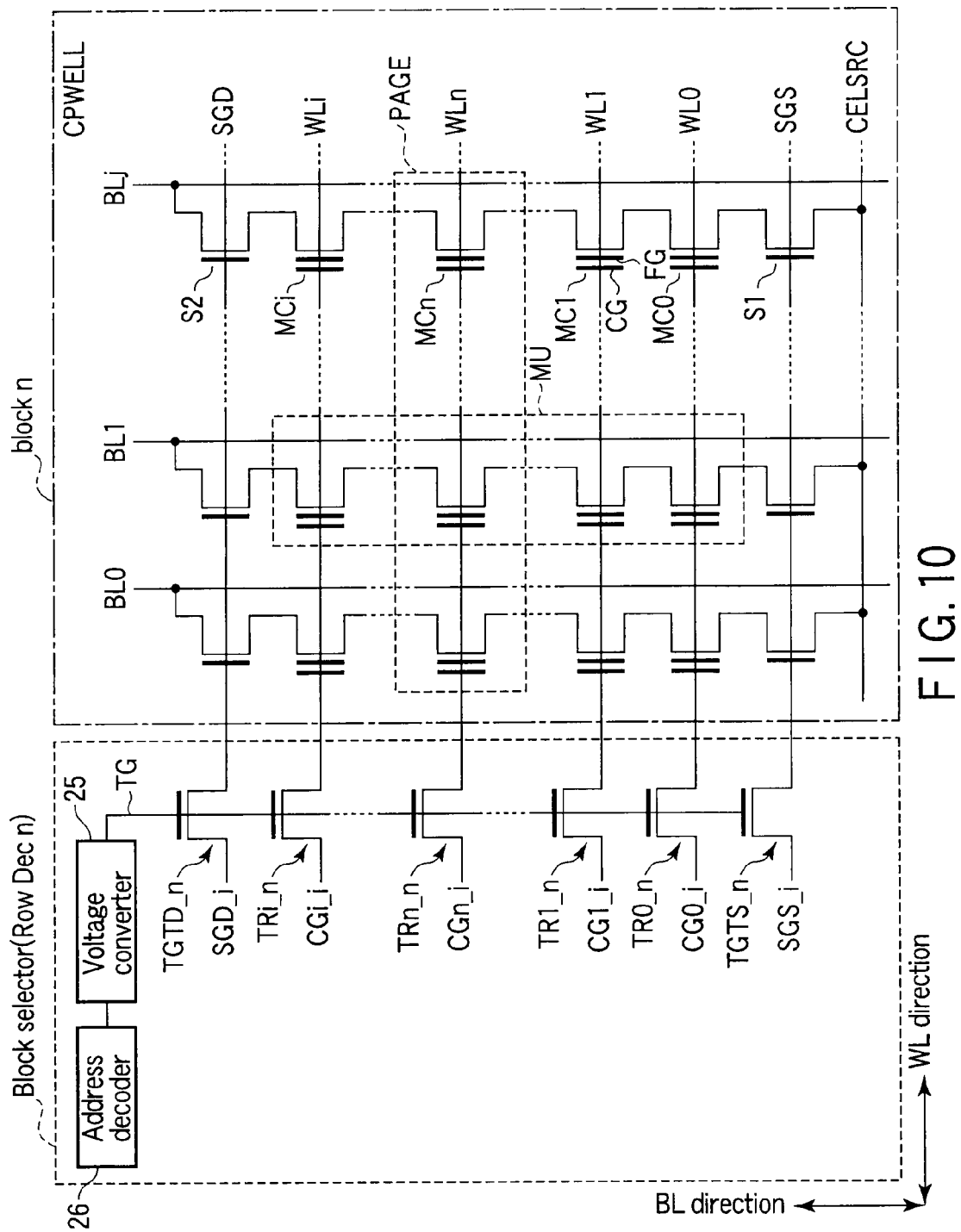
FIG. 10 is an equivalent circuit diagram showing a block and block selector according to the first embodiment.

As shown in FIG. 10, the block block n comprises a memory cell unit MU and selection transistors S1 and S2 for selecting the memory cell unit MU. In the memory cell unit MU, the current paths of a plurality of memory cell transistors MC0 to MC1 arranged in a matrix at the intersections of a plurality of bit lines BL0 to BLj and a plurality of word lines WL0 to WLi are connected in series.

The current path of the selection transistor S1 has one end connected to one end of the current path of the memory cell unit MU, and the other end connected to a source line CELSRC. The current path of the selection transistor S2 has one end connected to the other end of the current path of the memory cell unit MU, and the other end connected to one of the plurality of bit lines BL0 to BLj. Although this embodiment uses the two selection transistors, only one selection transistor may also be used as long as the memory cell unit MU can be selected.

Each of the memory cell transistors MC0 to MC1 has a structure in which a tunnel insulating film, floating electrode FG, inter-gate insulating film, and control electrode CG are sequentially stacked on a semiconductor substrate. This embodiment will be explained by taking the case where the floating electrode FG is a charge storage layer as an example, but the present invention is not limited to this. That is, the present invention is similarly applicable to a metal-oxide-nitride-oxide-silicon (MONOS) type device using, e.g., a silicon nitride film ($Si_3N_4$ film) as a charge storage layer instead of the floating electrode, or a tantalum nitride-aluminum oxide-nitride-oxide-silicon (TANOS) type device using a control electrode made of a tantalum nitride film and a high-k insulating film such as an alumina film ($Al_2O_3$ film) as a charge storage layer.

A page (PAGE) is formed for each of the word lines WL0 to WLi. Data read and write operations of the NAND flash memory are each performed at once for every page (PAGE). Accordingly, the page is a read unit and write unit.

The word lines WL0 to WLi run in the word-line direction, and are each connected to the control electrodes CG of a plurality of memory cell transistors MC in the word-line direction. A select gate line SGS runs in the word-line direction, and is connected to the gate electrodes of a plurality of selection transistors S1 in the word-line direction. A select gate line SGD also runs in the word-line direction, and is connected to the gate electrodes of a plurality of selection transistors S2 in the word-line direction.

The bit lines BL0 to BLj run in the bit-line direction, and are connected to sense amplifiers S/A in the page buffer, thereby reading out data from the memory cell transistors MC.

The block selector (RDn) comprises transfer transistors TGTS_n, TGTD_n, and TR0_n to TRi_n, a voltage converter 25, and an address decoder 26.

The transfer transistors TGTS_n, TGTD_n, TR0_n to TRi_n are high-breakdown-voltage transistors having gates connected together to a transfer gate line TG. A block selection signal indicating whether to select the block n is input to the transfer gate line TG The voltage converter 25 and address decoder 26 generate the block selection signal.

The current path of the transfer transistor TGTS_n has one end connected to the select gate SGS, and the other end SGS_i connected to an SGS driver (not shown). Likewise, the current path of the transfer transistor TGTD_n has one end connected to the select gate SGD, and the other end SGD_i connected to an SGD driver (not shown).

The current paths of the transistor transistors TR0_n to TRi_n each have one end connected to a corresponding one of the word lines WL0 to WLi, and have the other ends CG0_i to CGi_i connected to a WL driver (not shown).

1-6. Examples of Planar Arrangement and Sectional

Arrangement of Row Decoder

Examples of the planar arrangement and sectional arrangement of the row decoder will be explained below with reference to FIGS. 11 and 12. The row decoder 22-2 on the right side will be explained as an example.

As shown in FIG. 11, the row decoder 22-2 comprises a plurality of block selectors ( ..., RDn, RDn+3, ... ) each having a plurality of transfer transistors (TR0 to TRi). The diffusion layer of the source S as one end of the current path of each transfer transistor is electrically connected to a corresponding one of a plurality of word lines (WL0 to WL1). The plurality of block selectors ( ..., RDn, RDn+3, ... ) are formed to correspond to the plurality of blocks ( ..., block n, block n+3, ... ) Also, two block selectors (RDn and RDn+1) are arranged adjacent to each other in the word-line direction.

Furthermore, the diffusion layers (S) as the ends of the current paths of the transfer transistors (TR0 to TR1) are formed to oppose each other in the block selectors (RDn and RDn+1). For example, the diffusion layers (S) of the transfer transistors (TR0_n to TRi_n) in the block selector (RDn) are formed to oppose each other in the block selector (RDn).

In addition, the width (W2) between the diffusion layers of the sources S of the block selectors (RDn and RDn+1) adjacent to each other in the word-line direction (channel-width direction) is made larger than the width (W1) between the diffusion layers of the sources S in each of the block selectors (RDn and RDn+1) adjacent to each other in the word-line direction (widths: W2>W1). For example, the width W2 between the diffusion layer of the source S of the transfer transistor TR0_n in the block selector RDn and the diffusion layer of the source S of the transfer transistor TR0_n+3 in the other block selector (RDn+1) adjacent to the block selector RDn in the word-line direction is made larger than the width W1 between the diffusion layers of the sources S of the transfer transistors TR0_n and TR1_n adjacent to each other in the word-line direction in the same block selector (RDn) (widths: W2>W1).

The diffusion layer of a drain D as the other end of the current path of each transfer transistor is electrically connected to a word line driver (not shown). The gate electrodes ( ..., TG_n, TG_n+3, TG_n+4, TG_n+7, ... ) are each electrically connected to a transfer gate line.

FIG. 12 shows the sectional structure of the block selector RDn. FIG. 12 is a sectional view taken along a line XII-XII in FIG. 11.

As shown in FIG. 12, transfer transistors TR0_n and TRi–1_n as high-breakdown-voltage transistors are arranged to sandwich an element isolation insulating film STI on a semiconductor substrate (P-well (P-sub)) 41. Each of the transfer transistors TR0_n and TRi–1_n comprises a gate insulating film 39 formed on the semiconductor substrate 41, a gate electrode TG_n formed on the gate insulating film 39, and the source S (an n+ diffusion layer) and the drain D (an n+ diffusion layer) formed apart from each other in the substrate 41 so as to sandwich the gate electrode TG_n.

An interlayer dielectric film 42 is formed to cover the transfer transistors TR0_n and TRi_n.

2. Data Erase Operation

A data erase operation of the nonvolatile semiconductor device of this embodiment will be explained below with reference to FIGS. 13 to 19. The row decoder 22-2 on the right side will be explained as an example. In this explanation, the block block n+3 is a selected block, and the block block n is an unselected block.

2-1. Selected Block

FIG. 13 shows the voltage relationship in the selected block block n+3 and the block selector RDn+3 for selecting the block in the data erase operation.

In the selected block block n+3 as shown in FIG. 13, the transfer gate line TG is charged to an internal power supply voltage Vdd. In addition, the internal power supply voltage Vdd is applied to the other ends SGS_i and SGD_i of the current paths of the transfer transistors. A ground power supply voltage of 0 V is applied to the other ends CG0_i to CGi_i of the transfer transistors.

After that, a well voltage CPWELL in the selected block block n+3 is raised to an erase voltage of, e.g., about 20 V.

2-2. Unselected Block

FIG. 14 shows the voltage relationship in the unselected block block n and the block selector RDn for selecting the block in the data erase operation.

In the unselected block block n as shown in FIG. 14, the transfer gate line TG is charged to about a ground power supply voltage of 0 V. The internal power supply voltage Vdd is applied to the other ends SGS_i and SGD_i of the current paths of the transfer transistors, because the word lines are the same as those of the selected block block n+3. A ground power supply voltage of 0 V is applied to the other ends CG0_i to CGi_i of the current paths of the transfer transistors. The well voltage CPWELL is also raised to an erase voltage of about 20 V because the well voltage CPWELL is the same as that of the selected block block n+3.

In the unselected block block n, the transfer transistor is cut off because a ground power supply voltage of 0 V is applied to the transfer gate line TG Accordingly, one end of the current path of the transfer transistor floats, and a floating voltage FL is applied to the word lines WL0 to WLi.

2-3. Voltage Relationship in Row Decoder in Erase Operation

Figure 15:
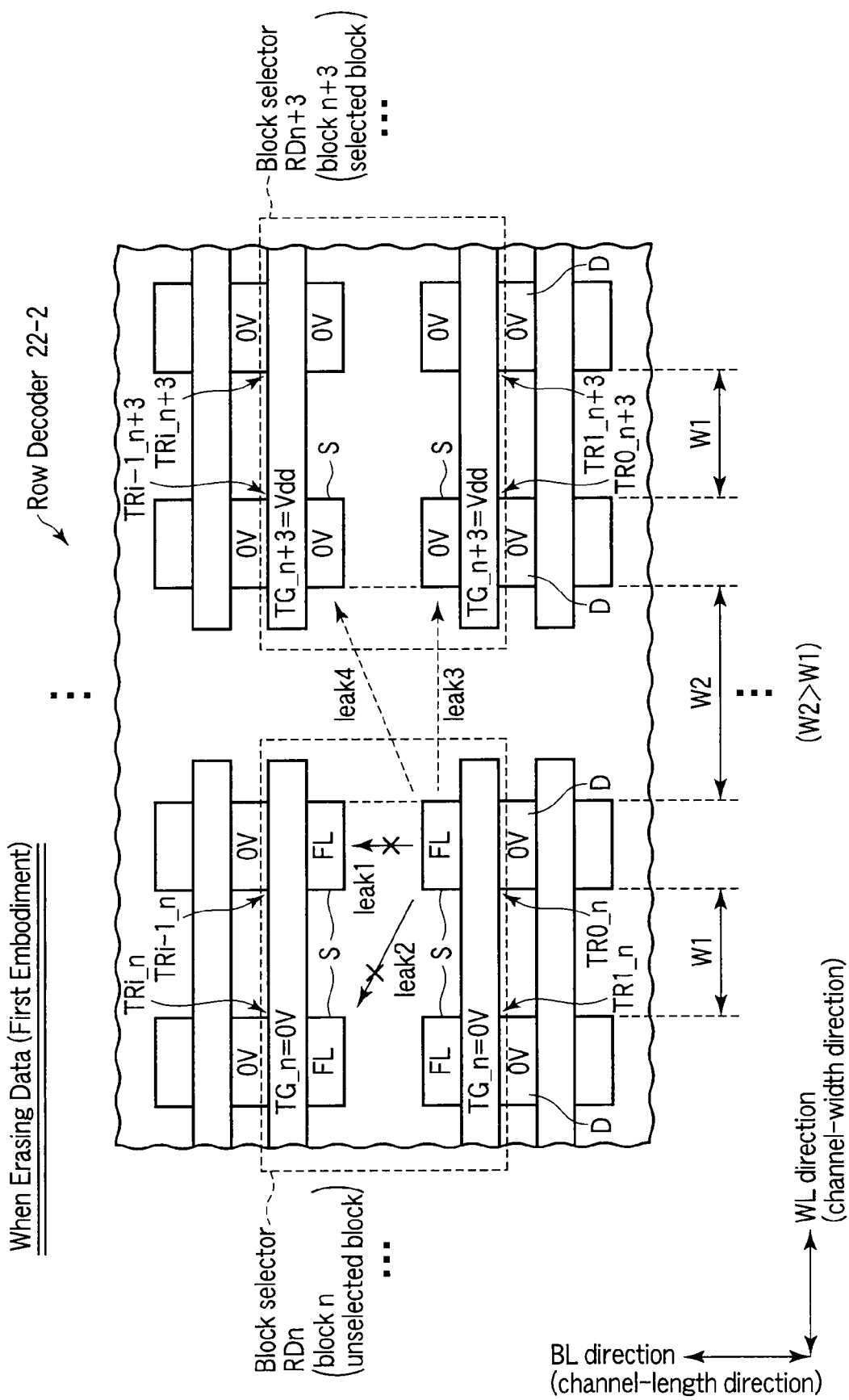
FIG. 15 is a plan view showing the voltage relationship in the row decoder according to the first embodiment when erasing data.
Figure 16:
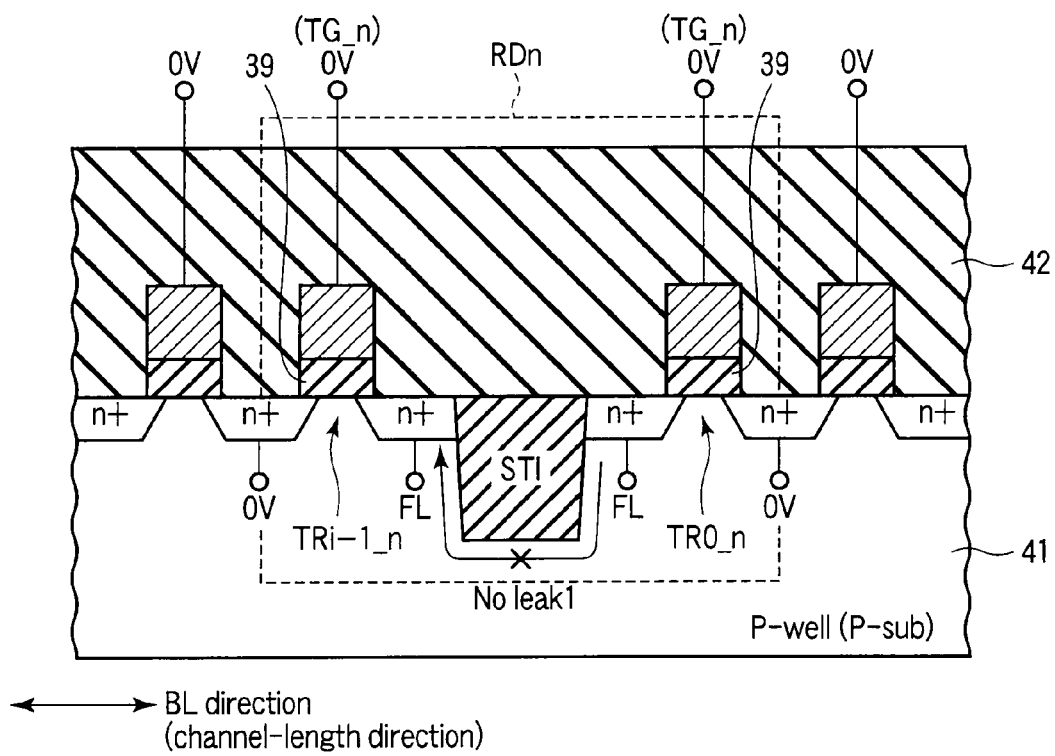
FIG. 16 is a sectional view showing the voltage relationship in an unselected block according to the first embodiment when erasing data.

In this case, the voltage relationship in the row decoder 22-2 is as shown in FIGS. 15 and 16.

As shown in FIGS. 15 and 16, a ground power supply voltage of 0 V is applied to the diffusion layer of the source S of the transfer transistor in the block selector RDn+3 corresponding to the selected block block n+3.

On the other hand, the floating voltage FL of about 20 V is applied to the diffusion layer of the source S of the transfer transistor in the block selector RDn corresponding to the unselected block block n.

As described previously, the diffusion layers (S) as the ends of the current paths of the transfer transistors (TR) are formed to oppose each other in the block selectors blocks RDn and RDn+3. In other words, the sources S of the diffusion layers connected to the word lines WL are formed to oppose each other in the same block selector. For example, the sources S of the diffusion layers of the transfer transistors TR0_$n$ to TRi_n in the block selector RDn are formed to oppose each other in the block selector RDn.

In the data erase operation, therefore, the voltage relationship is such that the same floating voltage FL is applied to the sources S as the diffusion layers of the transfer transistors TR0_$n$ to TRi_n. Consequently, neither a leakage current leak1 nor a leakage current leak2 is generated as shown in FIGS. 15 and 16. The leakage current leak1 is a leakage current between the diffusion layers, which oppose each other, of transfer transistors adjacent to each other in the BL direction (channel-length direction). The leakage current leak2 is a leakage current between the diffusion layers, which obliquely oppose each other, of similar transfer transistors.

In addition, the width (W2) between the diffusion layers S of the block selectors RDn and RDn+3 adjacent to each other in the word-line direction is made larger than the width (W1) between the diffusion layers S in each of the block selectors RDn and RDn+3 adjacent to each other in the word-line direction (widths: W2>W1). In other words, the space (W2) between the diffusion layers of the block selectors RDn and RDn+3 adjacent to each other in the WL direction is made wider than the space (W1) between the diffusion layers in the WL direction in the same block selector.

As shown in FIG. 15, therefore, it is possible to reduce leakage currents leak3 and leak4 generated between the first and second block selectors RDn and RDn+3 adjacent to each other in the WL direction. The leakage current leak3 is a leakage current generated between the diffusion layers S opposing each other in the WL direction in the block selectors RDn and RDn+3. The leakage current leak4 is a leakage current generated between the diffusion layers S obliquely opposing each other in the block selectors RDn and RDn+3.

The current amounts of the leakage currents leak3 and leak4 can be made negligibly small by making the width W2 larger than the width W1. Accordingly, the leakage currents leak3 and leak4 can be reduced.

Thus, the arrangement according to this embodiment is advantageous in the ability to reduce the leakage currents in the row decoder 22-2.

2-4. Voltage Relationship in Memory Cell in Erase Operation

Figure 17:
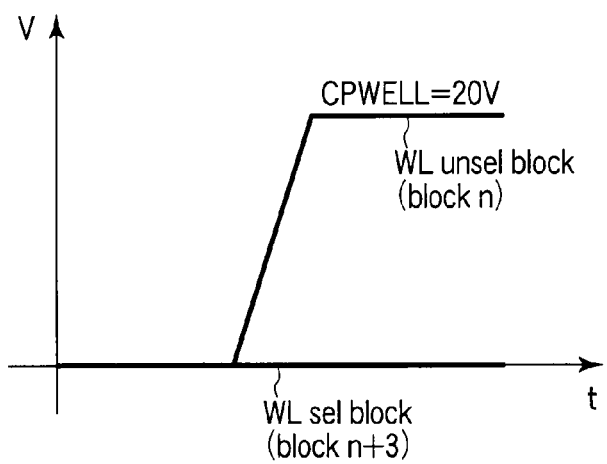
FIG. 17 is a graph showing the operating waveforms of the well voltage and word-line voltage when erasing data in the nonvolatile semiconductor device according to the first embodiment.

Accordingly, the operating waveforms of the well voltage CPWELL and word-line voltage in the data erase operation of the nonvolatile semiconductor device according to this embodiment are as shown in FIG. 17. Referring to FIG. 17, WL sel block indicates the word-line potential of the selection block block n+3, and WL unsel block indicates the word-line potential of the unselected block block n.

As shown in FIG. 17, the word-line potential WL unsel block of the unselected block block n+3 of this embodiment can be set to float without any leakage current. Even when the well voltage CPWELL is raised to an erase voltage of about 20 V, therefore, the word-line potential WL unsel block can be raised to a predetermined erase voltage by coupling together with the well voltage CPWELL.

Figure 18:
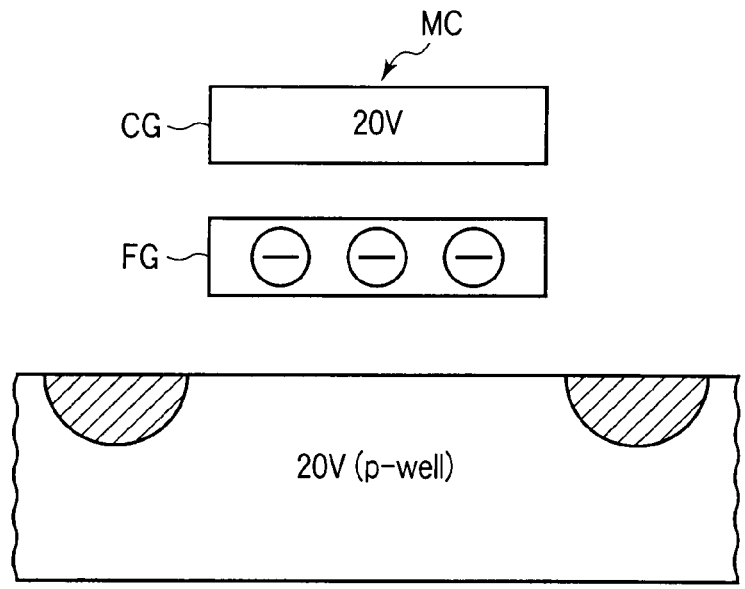
FIG. 18 is a sectional view showing the voltage relationship in a memory cell of an unselected block according to the first embodiment when erasing data.

Consequently, the voltage relationship in the memory cell MC of the unselected block block n+3 in the data erase operation according to this embodiment is as shown in FIG. 18. As shown in FIG. 18, an erase voltage of about 20 V is applied to both the control electrode CG of the memory cell MC and the well (p-well) in the unselected block block n+3. Thus, the voltage relationship in this embodiment is such that no potential difference is produced between the control electrode CG and well (p-well). Therefore, no electrons in the floating electrode FG are extracted to the well (p-well), so data can be held. This makes the embodiment advantageous in the ability to prevent erase errors and reduce defective bits.

Figure 19:
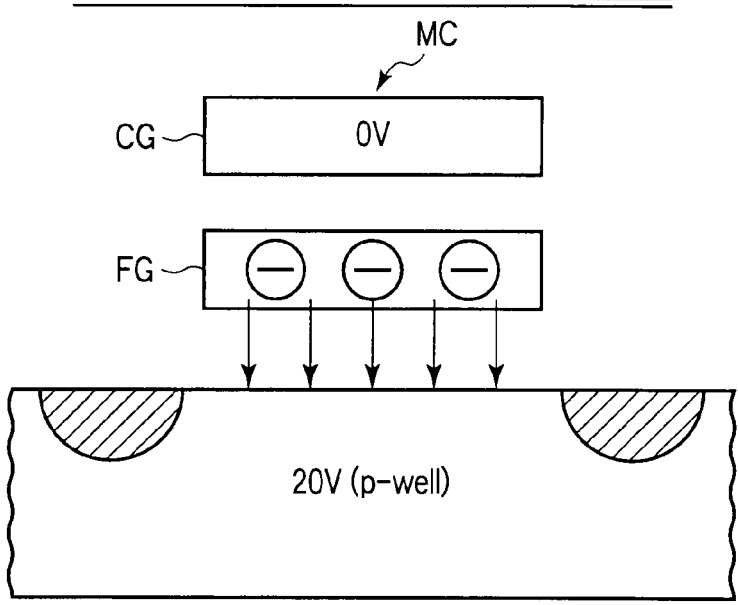
FIG. 19 is a sectional view showing the voltage relationship in a memory cell of a selected block according to the first embodiment when erasing data.

On the other hand, the voltage relationship in the memory cell MC of the selected block n in the data erase operation according to this embodiment is as shown in FIG. 19. As shown in FIG. 19, a ground power supply voltage of about 0 V is applied to the control electrode CG of the memory cell MC in the selected block block n, and the well voltage CPWELL is raised to an erase voltage of about 20 V.

Accordingly, a predetermined potential difference of about 20 V is produced between the control electrode CG and well (p-well), so data is erased by extracting electrons from the floating electrode FG into the well (p-well).

3. Effects of This Embodiment

The semiconductor memory device according to this embodiment achieves at least effects (1) and (2) below.

(1) The device is advantageous in preventing erase errors in memory cells because leakage currents in the row decoder can be reduced.

As described previously, the semiconductor memory device according to this embodiment comprises the memory cell array 21 and row decoder 22-1. The memory cell array 21 comprises a plurality of blocks each including the memory cell unit MU, and the selection transistors S1 and S2 for selecting the memory cell unit. In the memory cell unit MU, the current paths of a plurality of memory cells arranged in a matrix at the intersections of a plurality of bit lines and a plurality of word lines are connected in series. The row decoder 22-1 comprises the first and second block selectors (RDn and RDn+3) arranged adjacent to each other in the word-line direction. The first and second block selectors (RDn and RDn+3) each have a plurality of transfer transistors (TR), and are formed to correspond to a plurality of blocks. One end of the current path of each transfer transistor (TR) is electrically connected to a corresponding one of a plurality of word lines.

The diffusion layers (S) as the ends of the current paths of the transfer transistors (TR) are formed to oppose each other in the first and second block selectors.

The width (W2) between the diffusion layers of the first and second block selectors adjacent to each other in the word-line direction is made larger than the width (W1) between the diffusion layers in each of the first and second block selectors adjacent to each other in the word-line direction (widths: W2>W1).

First, as described above, the diffusion layers (S) as the ends of the current paths of the transfer transistors (TR) are formed to oppose each other in the first and second block selectors (RDn and RDn+3). In other words, the sources S of the diffusion layers connected to the word line WL are arranged to oppose each other in the same block selector. For example, the sources S as the diffusion layers of the transfer transistors TR0_$n$ to TRi_n in the block selector RDn are formed to oppose each other in the block selector RDn.

In the data erase operation of the memory cell transistor MC, therefore, the voltage relationship is such that the same floating voltage FL is applied to the sources S as the diffusion layers of the transfer transistors TR0_$n$ to TRi_n. Consequently, neither the leakage current leak1 nor the leakage current leak2 is generated as shown in FIGS. 15 and 16.

Second, the width (W2) between the diffusion layers of the first and second block selectors (RDn and RDn+3) adjacent to each other in the word-line direction is made larger than the width (W1) between the diffusion layers in each of the first and second block selectors adjacent to each other in the word-line direction (widths: W2>W1). In other words, the space (W2) between the diffusion layers of the block selectors adjacent to each other in the WL direction is made wider than the space (W1) between the diffusion layers in the WL direction in the same block selector. For example, the width (W2) between the diffusion layers S of the first and second block selectors RDn and RDn+3 adjacent to each other in the word-line direction is made larger than the width (W1) between the diffusion layers S in each of the first and second block selectors RDn and RDn+3 adjacent to each other in the word-line direction (widths: W2>W1).

As shown in FIG. 15, therefore, it is possible to reduce the leakage currents leak3 and leak4 generated between the first and second block selectors RDn and RDn+3 adjacent to each other in the WL direction.

The current amounts of the leakage currents leak3 and leak4 can be made negligibly small because the width W2 is made larger than the width W1. Accordingly, the arrangement shown in FIG. 15 can reduce the leakage currents leak3 and leak4.

Consequently, as shown in FIG. 17, the word-line potential WL sel block of the selected block block n+3 of this embodiment can be set to float without any leakage current. Even when the well voltage CPWELL is raised to an erase voltage of about 20 V, therefore, the word-line potential WL unsel block can be raised to a predetermined erase voltage by coupling together with the well voltage CPWELL.

As shown in FIG. 18, therefore, an erase voltage of about 20 V is applied to both the control electrode CG of the memory cell MC and the well (p-well) in the unselected block block n+3 when erasing data. Thus, the voltage relationship in this embodiment is such that no potential difference is produced between the control electrode CG and well (p-well). Accordingly, no electrons in the floating electrode FG are extracted to the well (p-well), so data can be held. This makes the device advantageous in the ability to prevent erase errors and reduce defective bits.

Thus, the arrangement according to this embodiment is capable of reducing the leakage currents in the row decoder, and advantageous in preventing erase errors in memory cells.

(2) The device is advantageous in increasing the capacity and advancing micropatterning.

As described above, the arrangement according to this embodiment is capable of reducing the leakage currents in the row decoder, and advantageous in preventing erase errors in memory cells.

Accordingly, while the distance between interconnections is shortened by the progress of micropatterning resulting from the increase in capacity, even when the voltage relationship is such that a high erase voltage of, e.g., about 20 V is applied, it is possible to prevent leakage currents and ensure a high breakdown voltage. This makes the device advantageous in increasing the capacity and advancing micropatterning.

Second Embodiment

Example of Staggered Layout

A semiconductor memory device according to the second embodiment will be explained below with reference to FIGS. 20 to 22. This embodiment is directed to an example in which block selectors are staggered. In this explanation, a repetitive explanation of the same features as in the first embodiment described above will be omitted.

Example of Arrangement

Figure 21:
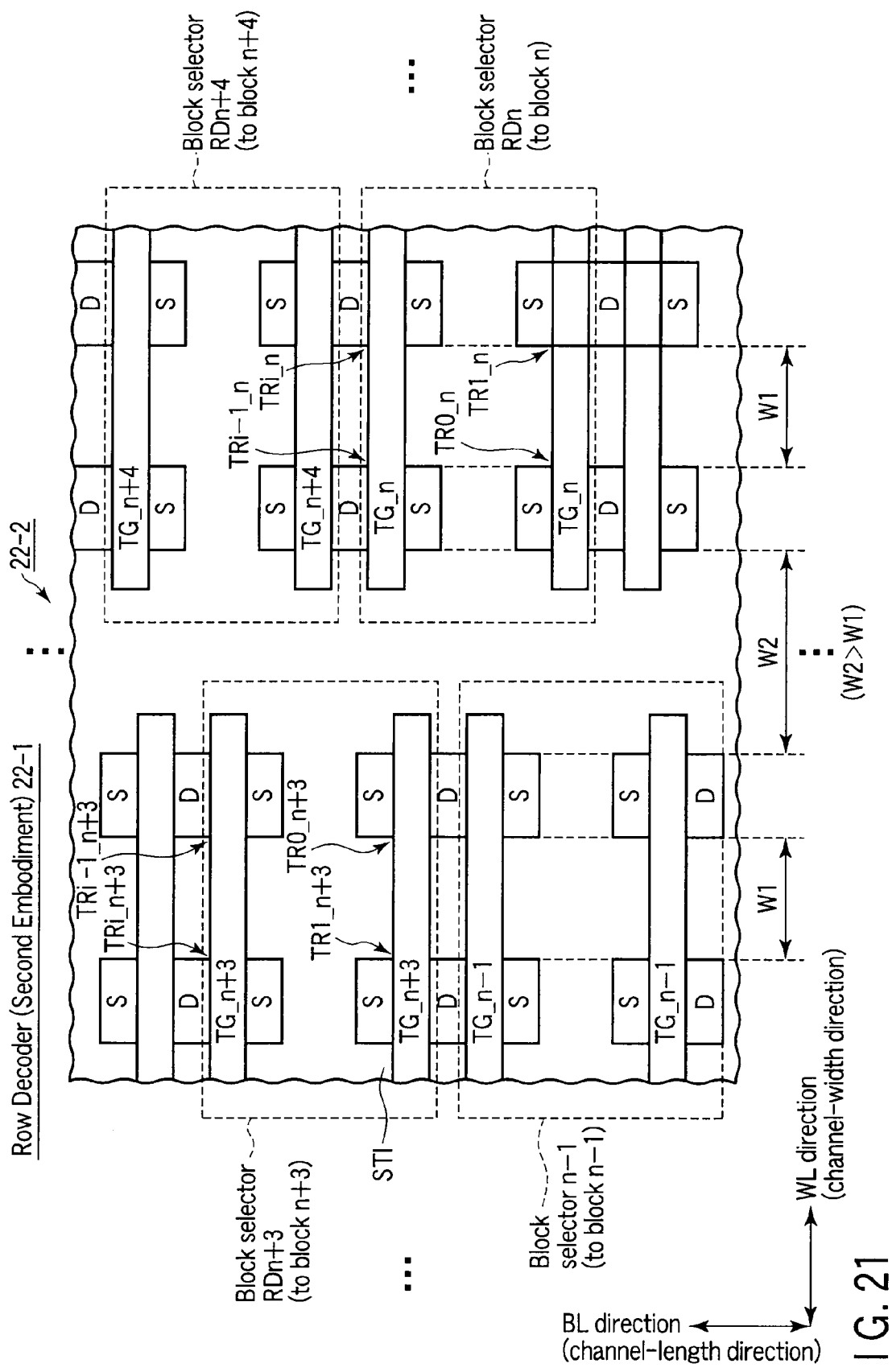
FIG. 21 is a plan view showing a row decoder of the nonvolatile semiconductor device according to the second embodiment.

As shown in FIGS. 20 and 21, this embodiment differs from the first embodiment in that two block selectors in each of row decoders 22-1 and 22-2 are staggered at, e.g., about a ½ pitch in the bit-line direction. For example, first and second block selectors (RDn and RDn+3) are staggered at about a ½ pitch in the bit-line direction.

<Voltage Relationship in Data Erase>

Accordingly, the voltage relationship in the row decoder 22-2 according to this embodiment when erasing data is as shown in FIG. 22.

As shown in FIG. 22, a ground power supply voltage of 0 V is applied to the diffusion layer of a source S of a transfer transistor in the block selector RDn+3 corresponding to a selected block block n+3. On the other hand, a floating voltage FL of about 20 V is applied to the diffusion layer of the source S of a transfer transistor in the block selector RDn corresponding to an unselected block block n.

As described previously, the diffusion layers (S) as the ends of the current paths of transfer transistors (TR) are formed to oppose each other in the block selectors RDn and RDn+3.

In a data erase operation, therefore, the voltage relationship is such that the same floating voltage FL is applied to the sources S as the diffusion layers of transfer transistors TR0_n to TRi_n. Consequently, neither a leakage current leak1 nor a leakage current leak2 is generated as shown in FIG. 22.

Furthermore, the width (W2) between the diffusion layers S of the block selectors RDn and RDn+3 adjacent to each other in the word-line direction is made larger than the width (W1) between the diffusion layers S in each of the block selectors RDn and RDn+3 adjacent to each other in the word-line direction (widths: W2>W1).

Additionally, in this embodiment, the block selectors RDn and RDn+3 are staggered at about a ½ pitch in the bit-line direction.

As shown in FIG. 22, therefore, it is possible to further reduce leakage currents leak3 and leak4 generated between the first and second block selectors RDn and RDn+3 adjacent to each other in the WL direction.

As described above, the semiconductor memory device according to this embodiment achieves at least the same effects as effects (1) and (2) described earlier.

Additionally, in this embodiment, the two block selectors in each of the row decoders 22-1 and 22-2 are staggered at, e.g., about a ½ pitch in the bit-line direction.

This makes the second embodiment advantageous in that, as shown in FIG. 22, the leakage currents leak3 and leak4 obliquely generated can be reduced more than in the first embodiment during the data erase operation.

Comparative Example

For comparison with the semiconductor memory devices according to the first and second embodiments described above, a semiconductor memory device according to a comparative example will be explained below with reference to FIGS. 23 to 28.

Example of Arrangement

FIG. 23 shows an example of the arrangement of a memory cell array unit according to the comparative example. Also, FIG. 24 shows the arrangement of a row decoder (right side) 22-2 shown in FIG. 23.

As shown in FIG. 24, a plurality of block selectors ( . . . , RDn, RDn+3, RDn+4, . . . ) are arranged along the bit line.

For example, the block selectors RDn+3 and RDn+4 are laid out such that diffusion layers (S) of transfer gate transistors connected to word lines WLn oppose each other.

<Voltage Relationship in Data Erase>

Accordingly, the voltage relationship according to the comparative example when erasing data is as shown in FIGS. 25 and 26. In this explanation, a block block n+4 is a selected block, and a block block n+3 is an unselected block.

In this voltage relationship, two leakage currents leak1 and leak2 described below are generated as major leakage currents by transfer transistors. That is, the leakage current leak1 is a leakage current between the diffusion layers (S) of transfer transistors, which oppose each other, of the block selectors (RDn+3 and RDn+4) adjacent to each other in the bit-line direction (channel-length direction). The leakage current leak2 is a leakage current between the diffusion layers (S) of transfer transistors, which obliquely oppose each other, of the block selectors (RDn+3 and RDn+4) adjacent to each other in the bit-line direction. As shown in FIG. 26, therefore, the device is disadvantageous in that the leakage currents leak1 and leak2 are generated beyond an element isolation insulating film STI.

Figure 27:
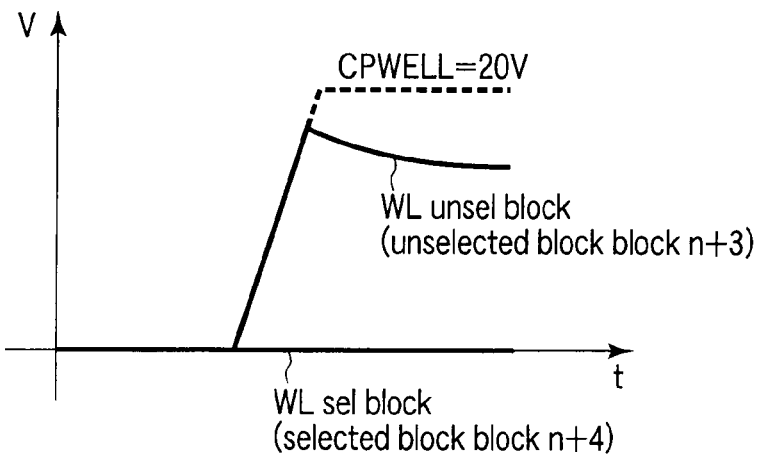
FIG. 27 is a graph showing the operating waveforms of the well voltage and word-line voltage when erasing data in the nonvolatile semiconductor device according to the comparative example.

Accordingly, the operating waveforms of a well voltage CPWELL and word-line voltage in the data erase operation of the semiconductor memory device according to this comparative example is as shown in FIG. 27. Referring to FIG. 27, WL sel block indicates the word-line potential of the selected block block n+4, and WL unsel block indicates the word-line potential of the unselected block block n+3.

As shown in FIG. 27, since the leakage currents are generated, the word-line potential WL unsel block of the unselected block block n+3 of this comparative example cannot be raised to a predetermined floating voltage (well voltage CPWELL=about 20 V), and remains lower than that. Even when the well voltage CPWELL is raised to an erase voltage of about 20 V, therefore, the word-line potential WL unsel block cannot be raised to a predetermined erase voltage by coupling together with the well voltage CPWELL.

Figure 28:
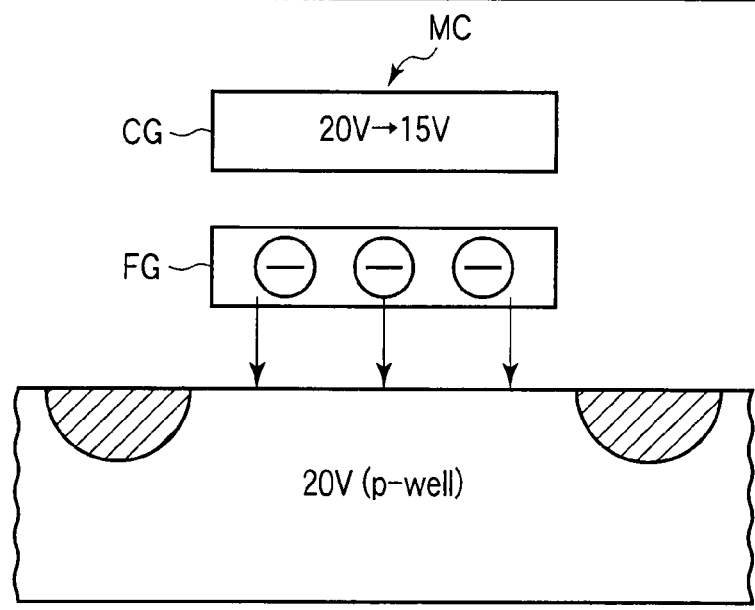
FIG. 28 is a sectional view showing the voltage relationship in a memory cell of an unselected block according to the comparative example when erasing data.

Consequently, the voltage relationship in a memory cell MC of the unselected block block n+3 in the data erase operation according to this comparative example is as shown in FIG. 28. As shown in FIG. 28, a voltage applied to a control electrode CG of the memory cell MC in the unselected block block n+3 is lower than the predetermined erase voltage (e.g., about 20 V→about 15 V) owing to the leakage currents leak1 and leak2. Therefore, if, for example, the voltage of the control electrode CG decreases from the erase voltage (about 20 V) to about 15 V, a potential difference of about 5 V is produced between the control electrode CG and a well (p-well). As a result, a weak erased state is produced, and electrons in a floating electrode FG of a memory cell in which data is to be held are extracted into a substrate. This makes the comparative example disadvantageous in that erase errors occur and the number of defective bits increases.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell array including a plurality of blocks each including a memory cell unit in which current paths of a plurality of memory cells arranged in a matrix at intersections of a plurality of bit lines and a plurality of word lines are connected in series, and a selection transistor which selects the memory cell unit; and
a row decoder including a first block selector and a second block selector each of which includes a plurality of transfer transistors having current paths whose ends are electrically connected to the plurality of word lines, and which are formed to correspond to the plurality of blocks and arranged adjacent to each other in a word-line direction,
wherein diffusion layers as the ends of the current paths of the transfer transistors are formed to oppose each other in the first block selector and the second block selector, and
a floating voltage is applied to the diffusion layers of the first block selector and a ground voltage is applied to the diffusion layers of the second block selector when data is erased from the memory cell.

2. The device according to claim 1, wherein when data is erased from the memory cell, a width between the diffusion layers of the first block selector and the second block selector adjacent to each other in the word-line direction is made larger than a width between the diffusion layers in each of the first block selector and the second block selector adjacent to each other in the word-line direction.

3. The device according to claim 1, wherein leakage between the diffusion layers of the first block selector is smaller than that between one of the diffusion layers of the first block selector and the diffusion layers of the second block selector.

4. The device according to claim 1, wherein when data is erased from the memory cell, a floating voltage raised to about an erase voltage by coupling is applied to the diffusion layer at the end of the current path of the transfer transistor in the first block selector corresponding to an unselected block, and
a ground voltage is applied to the diffusion layer at the end of the current path of the transfer transistor in the second block selector corresponding to a selected block.

5. The device according to claim 1, wherein the row decoder is placed on one side of the memory cell array.

6. The device according to claim 1, wherein the row decoder is placed on two sides of the memory cell array.

7. The device according to claim 6, wherein the plurality of blocks are alternately connected two by two to the row decoder.

8. The device according to claim 1, wherein each of the first block selector and the second block selector includes a voltage converter which inputs a block selection signal to a gate of the transfer transistor.

9. A semiconductor memory device comprising:
a memory cell array including a plurality of blocks each including a memory cell unit in which current paths of a plurality of memory cells arranged in a matrix at intersections of a plurality of bit lines and a plurality of word lines are connected in series, and a selection transistor which selects the memory cell unit; and
a row decoder including a first block selector and a second block selector each of which includes a plurality of transfer transistors having current paths whose ends are electrically connected to the plurality of word lines, and which are formed to correspond to the plurality of blocks and arranged adjacent to each other in a word-line direction, wherein diffusion layers as the ends of the current paths of the transfer transistors are formed to oppose each other in the first block selector and the second block selector, a floating voltage is applied to the diffusion layers of the first block selector and a ground voltage is applied to the diffusion layers of the second block selector when data is erased from the memory cell, and the first block selector and the second block selector are staggered by shifting pitches in a bit-line direction.

10. The device according to claim 9, wherein when data is erased from the memory cell, a width between the diffusion layers of the first block selector and the second block selector adjacent to each other in the word-line direction is made larger than a width between the diffusion layers in each of the first block selector and the second block selector adjacent to each other in the word-line direction.

11. The device according to claim 9, wherein leakage between the diffusion layers of the first block selector is smaller than that of between one of the diffusion layers of the first block selector and the diffusion layers of the second block selector.

12. The device according to claim 9, wherein when data is erased from the memory cell, a floating voltage raised to about an erase voltage by coupling is applied to the diffusion layer at the end of the current path of the transfer transistor in the first block selector corresponding to an unselected block, and a ground voltage is applied to the diffusion layer at the end of the current path of the transfer transistor in the second block selector corresponding to a selected block.

13. The device according to claim 9, wherein the row decoder is placed on one side of the memory cell array.

14. The device according to claim 9, wherein the row decoder is placed on two sides of the memory cell array.

15. The device according to claim 14, wherein the plurality of blocks are alternately connected two by two to the row decoder.

16. The device according to claim 9, wherein each of the first block selector and the second block selector further includes an address decoder which decodes an input address, and outputs the decoded address to the voltage converter.

* * * * *